(12) United States Patent
Miyauchi et al.

(10) Patent No.: US 9,729,042 B2
(45) Date of Patent: Aug. 8, 2017

(54) POWER SUPPLY APPARATUS FOR POWER CONVERTERS

(71) Applicant: DENSO CORPORATION, Kariya, Aichi-pref (JP)

(72) Inventors: Shun Miyauchi, Chiryu (JP); Tsuneo Maebara, Nagoya (JP)

(73) Assignee: DENSO CORPORATION, Kariya (JP)

( * ) Notice: Subject to any disclaimer, the term of this patent is extended or adjusted under 35 U.S.C. 154(b) by 22 days.

(21) Appl. No.: 14/737,847

(22) Filed: Jun. 12, 2015

(65) Prior Publication Data

US 2015/0364984 A1   Dec. 17, 2015

(30) Foreign Application Priority Data

Jun. 12, 2014   (JP) .................... 2014-121108

(51) Int. Cl.
| | |
|---|---|
| *H02M 3/335* | (2006.01) |
| *H02M 1/08* | (2006.01) |
| *H02M 7/5387* | (2007.01) |
| *H02M 7/00* | (2006.01) |

(Continued)

(52) U.S. Cl.
CPC .............. *H02M 1/08* (2013.01); *H02M 7/003* (2013.01); *H02M 7/5387* (2013.01); *H03K 17/567* (2013.01); *H03K 17/691* (2013.01)

(58) Field of Classification Search
CPC .. H02M 3/28; H02M 3/33561; H02M 7/5387; H02M 7/003; Y10T 307/469; H03K 17/567; Y02T 10/6217

USPC ....... 323/282–289; 363/17, 20, 21.04, 21.08, 363/21.12, 137; 307/31, 33, 52, 69, 83, 307/39

See application file for complete search history.

(56) References Cited

U.S. PATENT DOCUMENTS

| | | | | |
|---|---|---|---|---|
| 4,751,397 A | * | 6/1988 | Ide ...................... | H02M 7/5387 307/31 |
| 5,617,015 A | * | 4/1997 | Goder ...................... | G05F 1/56 323/282 |

(Continued)

FOREIGN PATENT DOCUMENTS

| | | |
|---|---|---|
| JP | H11-178356 A | 7/1999 |
| JP | 2010-273479 A | 12/2010 |

(Continued)

*Primary Examiner* — Rajnikant Patel
(74) *Attorney, Agent, or Firm* — Oliff PLC

(57) ABSTRACT

In a power supply apparatus, an upper-arm control unit includes a first switching element connected between a DC power source and a primary side of each upper-arm transformer. The upper-arm control unit controls on and off operations of a first voltage-controlled switching element to control supply of an output voltage of the DC power source to the primary side of each upper-arm transformer. A lower-arm control unit includes a second voltage-controlled switching element connected between the DC power source and a primary side of the at least one lower-arm transformer. The lower-arm control unit controls on and off operations of a second switching element to control supply of the output voltage to the primary side of the at least one lower-arm transformers. Each upper-arm transformer is arranged adjacent to the upper-arm control unit, and the at least one lower-arm transformer is arranged adjacent to the lower-arm control unit.

10 Claims, 9 Drawing Sheets

(51) Int. Cl.
*H03K 17/567* (2006.01)
*H03K 17/691* (2006.01)

(56) References Cited

U.S. PATENT DOCUMENTS

| | | | |
|---|---|---|---|
| 6,339,262 B1 * | 1/2002 | Igarashi | H02M 1/34 |
| | | | 307/31 |
| 6,504,267 B1 * | 1/2003 | Giannopoulos | H02M 3/33561 |
| | | | 307/31 |
| 8,093,852 B2 * | 1/2012 | Nakamura | B60L 11/1868 |
| | | | 318/471 |
| 8,284,575 B2 * | 10/2012 | Inamura | H02M 1/08 |
| | | | 318/800 |
| 2012/0112530 A1 * | 5/2012 | Komatsu | B60L 3/003 |
| | | | 307/9.1 |
| 2012/0134181 A1 | 5/2012 | Amano et al. | |
| 2012/0286717 A1 | 11/2012 | Fukuta et al. | |
| 2013/0039097 A1 | 2/2013 | Watanabe et al. | |
| 2014/0092653 A1 | 4/2014 | Suzuki et al. | |
| 2015/0085538 A1 | 3/2015 | Miyauchi et al. | |

FOREIGN PATENT DOCUMENTS

| | | |
|---|---|---|
| JP | 2012-120304 A | 6/2012 |
| JP | 2012-120345 A | 6/2012 |
| JP | 2015-065725 A | 4/2015 |

\* cited by examiner

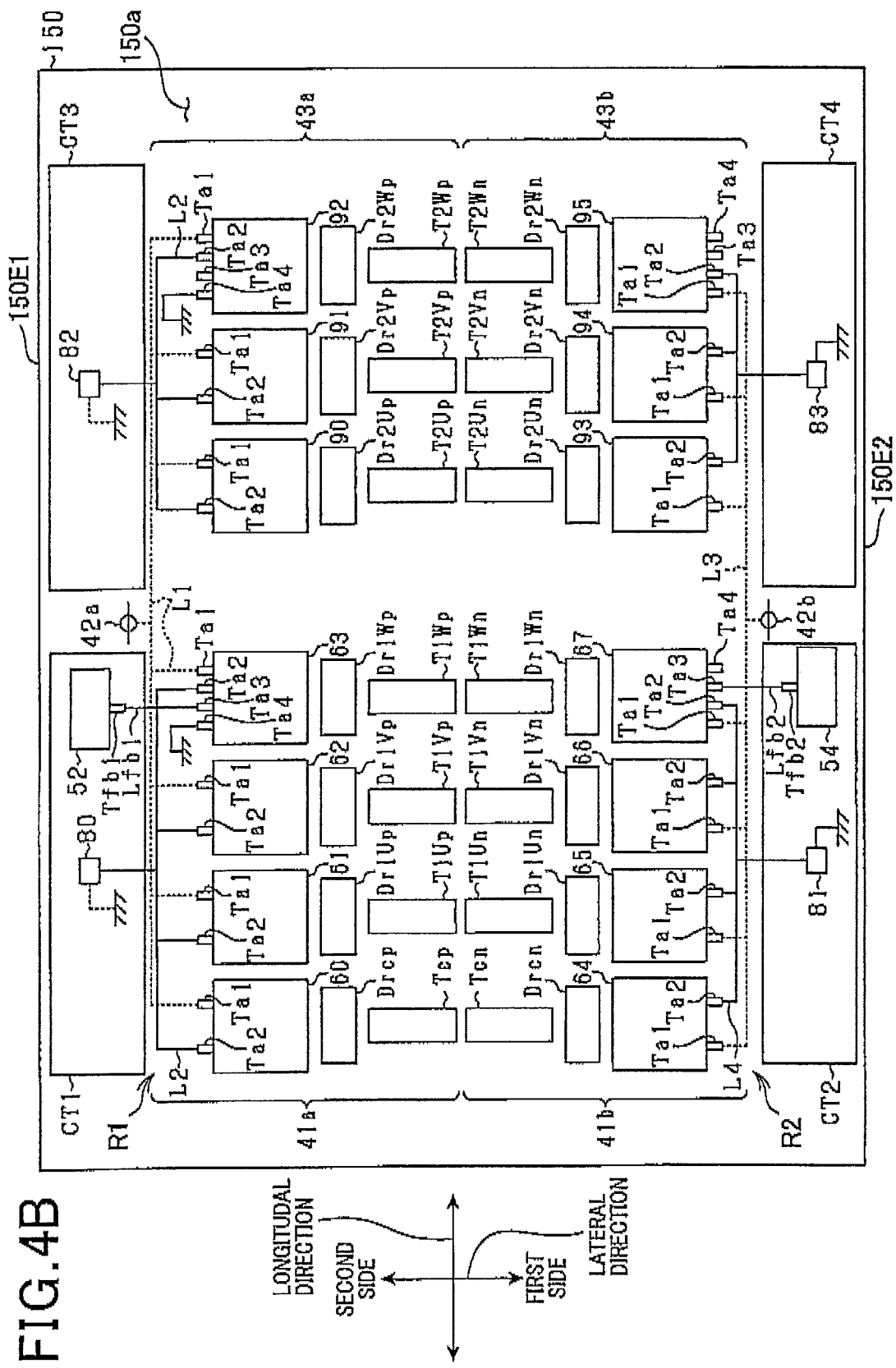

POWER SUPPLY APPARATUS FOR POWER CONVERTERS

CROSS REFERENCE TO RELATED APPLICATION

This application is based on and claims the benefit of priority from Japanese Patent Application No. 2014-121108 filed on Jun. 12, 2014, the disclosure of which is incorporated in its entirety herein by reference.

TECHNICAL FIELD

The present disclosure relates to power supply apparatuses for power converters.

BACKGROUND

Inverters, which are typical examples of power converters, are necessary components for controlling driving motors for hybrid and/or electric vehicles. Such an inverter includes upper- and lower-arm switching elements, each of which is preferably an insulated gate bipolar transistor (IGBT). Alternately turning on and off each of the IGBTs of the inverter converts DC power supplied from a DC power source into AC power. Alternately turning on and off each of the IGBTs of the inverter also converts AC power generated from a rotary electric machine into DC power.

For turning on or off each of the IGBTs of the inverter, a power supply circuit is used, one example of which is disclosed in Japanese Patent Application Publication No. H11-178356.

Such a power supply circuit is implemented in a board, and is connected to each IGBT of the inverter. The power supply circuit includes a gate driver and a transformer for each IGBT. The gate driver for each IGBT controls on or off of the corresponding IGBT. The transformer for each IGBT supplies power to the corresponding gate driver. The transformer for each IGBT includes a primary coil and a secondary coil magnetically coupled to the primary coil.

The power supply circuit also includes a power controller commonly provided for individually controlling all the IGBTs. The power controller includes a voltage-controlled switching element, such as a MOSFET, connected to the primary coil of each transformer.

Alternately turning on and off the voltage-controlled switching element alternately switches between a first mode supplying a current to the primary coil and a second mode interrupting the supply of the current to the primary coil. This current-control controls the operating state of each gate driver connected to the primary coil of a corresponding one of the transformers, thus controlling the switching operations of the IGBTs of the inverter.

SUMMARY

The power supply circuit described above includes the gate drivers for the respective IGBTs, the transformers for the respective IGBTs, and the power controller connected to the respective transformers; these gate drivers, transformers, and the power controller are implemented in a common board. This structure of the power supply circuit may result in an elongation of wiring paths connecting between the power controller and the primary coils of the respective transformers.

An increase in length of each of the wiring paths may result in an increase of radiated noise and/or conductive noise output from the wiring paths due to noise generated by the switching operations of the voltage-controlled switching element.

In view the circumstances set forth above, one aspect of the present disclosure seeks to provide power supply apparatuses for power converters, each of which is capable of addressing the problem set forth above.

Specifically, an alternative aspect of the present disclosure aims to provide such power supply apparatuses, each of which has shorter wiring paths, resulting in more reduction of radiated noise and/or conductive noise.

A power supply apparatus according to a first exemplary aspect of the present disclosure is provided for a power converter including a plurality of upper-arm switching elements and a plurality of lower-arm switching elements. The power supply apparatus includes a board; and an upper-arm power supply circuit mounted to the board. The upper-arm power supply circuit includes a plurality of upper-arm transformers connected to a DC power source and to the respective upper-arm switching elements. Each of the upper-arm transformers is configured to generate, based on an output voltage of the DC power source, a first voltage for driving a corresponding one of the upper-arm switching elements. The power supply apparatus includes a lower-arm power supply circuit mounted to the board. The lower-arm power supply circuit includes at least one lower-arm transformer connected to the DC power source and to the lower-arm switching elements. The at least one lower-arm transformer is configured to generate, based on the output voltage of the DC power source, a second voltage for driving each of the lower-arm switching elements. The power supply apparatus includes an upper-arm control unit mounted to the board. The upper-arm control unit includes a first voltage-controlled switching element connected between the DC power source and a primary side of each of the upper-arm transformers. The upper-arm control unit controls on and off operations of the first voltage-controlled switching element to thereby control supply of the output voltage of the DC power source to the primary side of each of the upper-arm transformers. The power supply apparatus includes a lower-arm control unit mounted to the board. The lower-arm control unit includes a second voltage-controlled switching element connected between the DC power source and a primary side of the at least one lower-arm transformer. The lower-arm control unit controls on and off operations of the second voltage-controlled switching element to thereby control supply of the output voltage of the DC power source to the primary side of the at least one lower-arm transformers. Each of the upper-arm transformers is arranged adjacent to the upper-arm control unit, and the at least one lower-arm transformer is arranged adjacent to the lower-arm control unit.

A power supply apparatus according to a second exemplary aspect of the present disclosure is provided for a power converter including a plurality of upper-arm switching elements and a plurality of lower-arm switching elements. The power supply apparatus includes a board having a mount surface, and an upper-arm power supply circuit mounted on the mount surface of the board. The upper-arm power supply circuit includes a plurality of upper-arm transformers and a plurality of upper-arm connectors. The upper-arm transformers are connected to a DC power source and to the respective upper-arm switching elements via the respective upper-arm connectors. Each of the upper-arm transformers is configured to generate, based on an output voltage of the DC power source, a first voltage for driving a corresponding one of the upper-arm switching elements. The upper-arm connectors are mounted on the mount surface to be aligned with each other. The power supply apparatus includes a lower-arm power supply circuit mounted on the mount surface of the board. The lower-arm power supply circuit includes at least one lower-arm transformer and a plurality of lower-arm connectors. The at least one lower-arm transformer is connected to the DC power source and to the lower-arm switching elements via the respective lower-arm connectors. The at least one lower-arm transformer is configured to generate, based on the output voltage of the DC power source, a second voltage for driving each of the lower-arm switching elements. The lower-arm connectors are mounted on the mount surface to be aligned. The power supply apparatus includes an upper-arm control unit mounted on the mount surface of the board. The upper-arm control unit includes a first voltage-controlled switching element connected between the DC power source and a primary side of each of the upper-arm transformers. The upper-arm control unit controls on and off operations of the first voltage-controlled switching element to thereby control supply of the output voltage of the DC power source to the primary side of each of the upper-arm transformers. The power supply apparatus includes a lower-arm control unit mounted on the mount surface of the board. The lower-arm control unit includes a second voltage-controlled switching element connected between the DC power source and a primary side of the at least one lower-arm transformer. The lower-arm control unit controls on and off operations of the second voltage-controlled switching element to thereby control supply of the output voltage of the DC power source to the primary side of the at least one lower-arm transformers. An alignment of the upper-arm connectors is juxtaposed to an alignment of the lower-arm connectors. The upper-arm transformers and the upper-arm control unit are arranged such that the upper-arm transformers and the alignment of the upper-arm connectors are sandwiched between the upper-arm control unit and the alignment of the lower-arm connectors. The at least one lower-arm transformer and the lower-arm control unit are arranged such that the at least one lower-arm transformer and the alignment of the lower-arm connectors are sandwiched between the lower-arm control unit and the alignment of the upper-arm connectors.

The configuration of each of the power supply apparatuses according to the first and second exemplary aspects results in each of the first and second upper-arm and lower-arm control units being arranged to be close to a corresponding one of the group of the upper-arm transformers and the at least one lower-arm transformer. This reduces the length of wiring paths connecting between each of the first and second upper-arm and lower-arm control units and a corresponding one of the group of the upper-arm transformers and the at least one lower-arm transformer. This reduces radiated noise and/or conductive noise output from the wiring paths.

The above and/or other features, and/or advantages of various aspects of the present disclosure will be further appreciated in view of the following description in conjunction with the accompanying drawings. Various aspects of the present disclosure, can include and/or exclude different features, and/or advantages where applicable. In addition, various aspects of the present disclosure can combine one or more feature of other embodiments where applicable. The descriptions of features, and/or advantages of particular embodiments should not be construed as limiting other embodiments or the claims.

BRIEF DESCRIPTION OF THE DRAWINGS

Other aspects of the present disclosure will become apparent from the following description of embodiments with reference to the accompanying drawings in which:

FIG. 4B is a view schematically illustrating a first outer mount surface of the board on which components are mounted according to the first embodiment;

DETAILED DESCRIPTION OF EMBODIMENT

Figure 1:
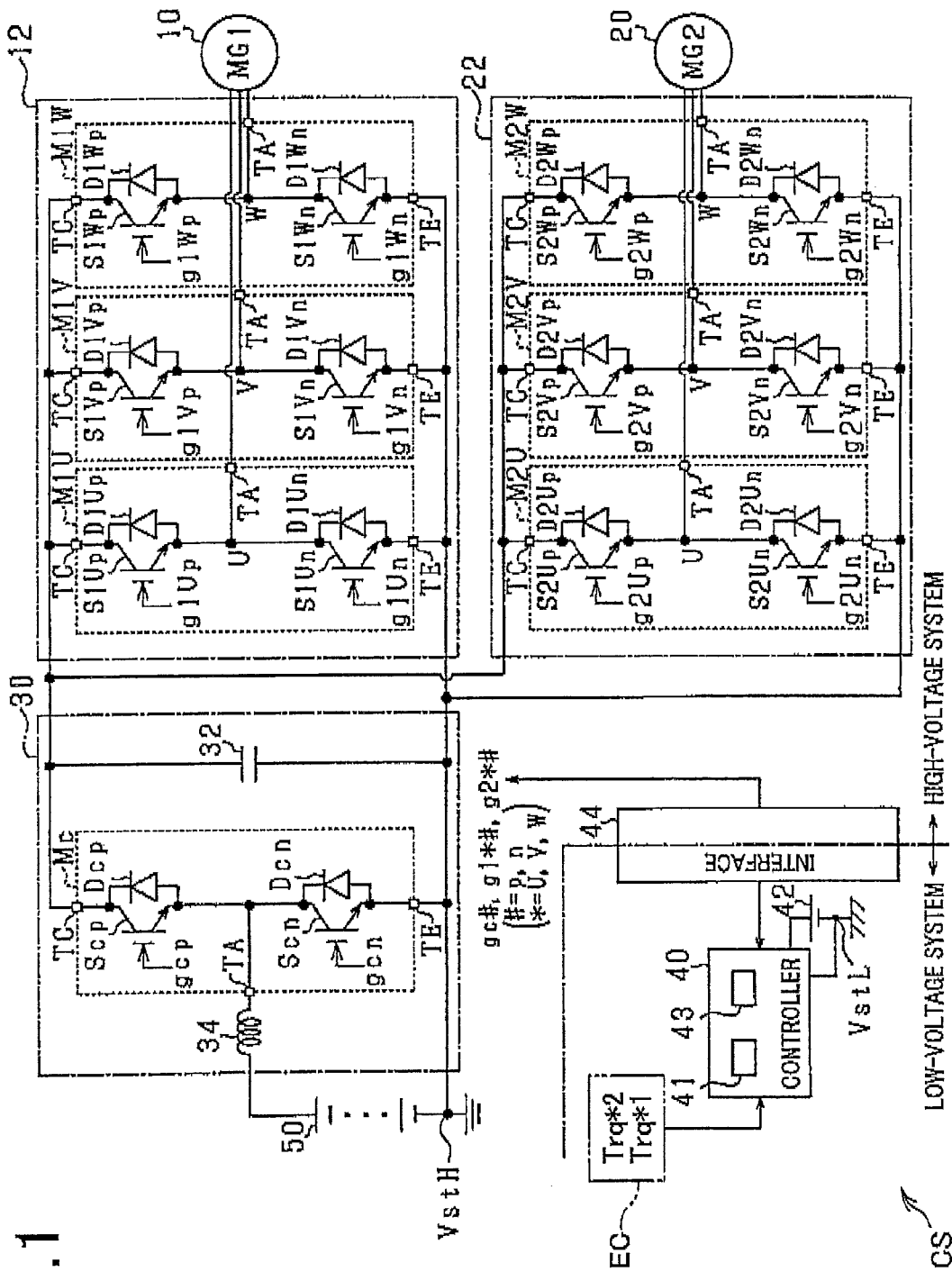
FIG. 1 is a circuit diagram schematically illustrating an example of the overall structure of a motor-generator control system according to the first embodiment of the present disclosure.

Specific embodiments of the present disclosure will be described hereinafter with reference to the accompanying drawings. In the embodiments, like parts between the embodiments, to which like reference characters are assigned, are omitted or simplified in order to eliminate redundant description.

First Embodiment

Referring to FIG. 1, a motor-generator control system CS according to the first embodiment of the present disclosure is installed in a hybrid vehicle. The hybrid vehicle is equipped with first and second motor-generators (MGs) 10 and 20 as an example of rotary machines and an internal combustion engine; the internal combustion engine, referred to simply as an engine, serves as a first main engine for moving the hybrid vehicle.

Referring to FIG. 1, the motor-generator control system CS for controlling the first and second MGs 10 and 20 includes first and second inverters 12 and 22, a booster converter 30, a controller 40, a low-voltage battery 42, an interface 44, and a high-voltage battery 50. Each of the first and second MGs 10 and 20 is coupled to driving wheels of the hybrid vehicle and/or a crankshaft of the engine via an unillustrated power split mechanism.

The first MG 10 includes three-phase windings connected to the first inverter 12. The first MG 10 serves as both a starter motor and a power generator. When serving as a starter motor, the first MG 10 provides initial rotation to the crankshaft of the engine, thus starting the engine. When serving as a power generator, the first MG 10 generates electrical power to be supplied to electrical components installed in the hybrid vehicle.

The second MG 20 includes three-phase windings connected to the second inverter 22. The second MG 20 serves as a second main engine for moving the hybrid vehicle.

For example, each of the first and second MGs 10 and 20 is designed as a three-phase brushless motor-generator.

Each of the first and second inverters 12 and 22 is a three-phase inverter, and is connected to the high-voltage battery 50 installed in the hybrid vehicle via the booster converter 30. A secondary battery, such as a lithium-ion battery or a nickel-hydrogen battery, is used as the high-voltage battery 50.

The booster converter 30 includes a capacitor 32, an inductor 34, an upper-arm booster switching element Scp, a lower-arm booster switching element Scn, a flywheel diode Dcp, and a flywheel diode Dcn.

For example, voltage-controlled switching elements, such as IGETs or MOSFETs, are used for the upper- and lower-arm booster switching elements Scp and Scn. The first embodiment uses JGBTs as the upper- and lower-arm booster switching elements Scp and Scn.

The upper- and lower-arm booster switching elements Scp and Scn are connected in series to each other to constitute a series connection member. The flywheel diode Dcp is connected in antiparallel to the upper-am booster switching element Scp, and the flywheel diode Dcn is connected in antiparallel to the lower-arm booster switching element Scn. The series connection member (Scp, Scn) and the flywheel diodes Dcp and Dcn are modularized to constitute a booster module Mc having terminals TC, TE, and TA. If MOSFETs are individually used as the upper- and lower-arm booster switching elements Scp and Son, intrinsic diodes of the MOSFETs can be used as the flywheel diodes.

The series connection member is connected in parallel to the capacitor 32 via the terminals TC and TE. A first end of the inductor 34 is connected to a positive terminal of the high-voltage battery 50, and a second end of the inductor 34 is connected to the connection point between the upper and lower-arm booster switching elements Scp and Scn via the terminal TA of the booster module Mc. A negative terminal of the high-voltage battery 50 is connected to a common signal ground of a high-voltage system described later.

The collector of the upper-arm switching element Scp is connected to a positive terminal of the first inverter 12 and that of the second inverter 22 via the terminal TC. The emitter of the lower-arm switching element Son is connected to a negative terminal of the first inverter 12 and that of the second inverter 22 via the terminal TE. Gates of the upper- and lower-arm switching elements Scp and Son are connected to the controller 40 via the interface 44.

Complementary, i.e. alternate, switching of the upper- and lower-arm switching elements Scp and Scn under control of the controller 40 boosts an output voltage of, for example, 288 V, output from the high-voltage battery 50 to a desirable value within the range equal to or lower than a predetermined upper limit of, for example, 650 V.

The first inverter 12 includes
1. A first pair of U-phase upper- and lower-arm switching elements S1Up and S1Un connected in series
2. A second pair of V-phase upper- and lower-arm switching elements S1Vp and S1Vn connected in series
3. A third pair of W-phase upper- and lower-arm switching elements S1Wp and S1Wn connected in series.

The first inverter 12 also includes flywheel diode D1*# (*=U, V, W, #=p, n). For example, voltage-controlled switching elements, such as IGBTs or MOSFETs, are used for the respective switching elements S1*#. The first embodiment uses IGBTs as the switching elements S1*#. Each of the flywheel diodes D1*# is connected in antiparallel to a corresponding one of the switching elements S1*#. The series-connected U-phase switching elements S1Up and S1Un and the respective flywheel diodes D1Up and D1Un are modularized to constitute a first U-phase switch module M1U having terminals TC, TE, and TA. Similarly, the series-connected V-phase switching elements S1Vp and S1Vn and the respective flywheel diodes D1Vp and D1Vn are modularized to constitute a first V-phase switch module M1V having terminals TC, TE, and TA. Additionally, the series-connected W-phase switching elements S1Wp and S1Wn and the respective flywheel diodes D1Wp and D1Wn are modularized to constitute a first W-phase switch module M1W having terminals TC, TE, and TA. If MOSFETs are individually used as the switching elements S1*#, intrinsic diodes of the MOSFETs can be used as the flywheel diodes.

The connection point between the U-phase upper- and lower-arm switching elements S1Up and S1Un serves as an AC I/O terminal connected to a first end of a U-phase winding of the first MG 10 via the terminal TA of the module M1U. The connection point between the V-phase upper- and lower-arm switching elements S1Vp and S1Vn serves as an AC I/O terminal connected to a first end of a V-phase winding of the first MG 10 via the terminal TA of the module M1V. The connection point between the W-phase upper- and lower-arm switching elements S1Wp and S1Wn serves as an AC I/O terminal connected to a first end of a W-phase winding of the first MG 10 via the terminal TA of the module M1W. Second ends of the respective U-, V-, and W-phase windings, which are opposite to the respective first ends, are connected to each other to constitute a neutral point.

The collectors of the *-phase upper-arm switching elements S1*p of the first inverter 12, i.e. the terminals TC, are commonly connected to each other to constitute the positive terminal of the first inverter 12. The emitters of the *-phase lower-arm switching elements S1*n of the first inverter 12, i.e. the terminals TE, are commonly connected to each other to constitute the negative terminal of the first inverter 12.

The first pair (S1Up and S1Un), the second pair (S1Vp and S1Vn), and the third pair (S1Wp and S1Wn) of the switching elements of the first inverter 12 are parallelly connected to each other in bridge configuration.

The second inverter 22 includes
1. A first pair of U-phase upper- and lower-arm switching elements S2Up and S2Un connected in series
2. A second pair of V-phase upper- and lower-arm switching elements S2Vp and S2Vn connected in series
3. A third pair of W-phase upper- and lower-arm switching elements S2Wp and S2Wn connected in series.

The second inverter 22 also includes flywheel diode D2*#. For example, voltage-controlled switching elements, such as IGBTs or MOSFETs, are used for the respective switching elements S2*#. The first embodiment uses IGBTs as the switching elements S2*#. Each of the flywheel diodes D2*# is connected in antiparallel to a corresponding one of the switching elements S2*#. The series-connected U-phase switching elements S2Up and S2Un and the respective flywheel diodes D2Up and D2Un are modularized to constitute a second U-phase switch module M2U having terminals TC, TE, and TA. Similarly, the series-connected V-phase switching elements S2Vp and S2Vn and the respective flywheel diodes D2Vp and D2Vn are modularized to constitute a second V-phase switch module M2V having terminals TC, TE, and TA. Additionally, the series-connected W-phase switching elements S2Wp and S2Wn and the respective flywheel diodes D2Wp and D2Wn are modularized to constitute a second W-phase switch module M2W having terminals TC, TE, and TA. If MOSFETs are individually used as the switching elements S2*#, intrinsic diodes of the MOSFETs can be used as the flywheel diodes.

The connection point between the U-phase upper- and lower-arm switching elements S2Up and S2Un serves as an AC I/O terminal connected to a first end of a U-phase winding of the second MG 20 via the corresponding terminal TA. The connection point between the V-phase upper- and lower-arm switching elements S2Vp and S2Vn serves as an AC I/O terminal connected to a first end of a V-phase winding of the second MG 20 via the corresponding terminal TA. The connection point between the W-phase upper- and lower-arm switching elements S2Wp and S2Wn serves as an AC I/O terminal connected to a first end of a W-phase winding of the second MG 20 via the corresponding terminal TA. Second ends of the respective U-, V-, and W-phase windings, which are opposite to the respective first ends, are connected to each other to constitute a neutral point.

The collectors of the *-phase upper-arm switching elements S2*p of the second inverter 22, in other words, the terminals TC, are commonly connected to each other to constitute the positive terminal of the second inverter 22. The emitters of the *-phase lower-arm switching elements S2*n of the second inverter 22, i.e. the terminals TE, are commonly connected to each other to constitute the negative terminal of the second inverter 22.

The first pair (S2Up and S2Un), the second pair (S2Vp and S2Vn), and the third pair (S2Wp and S2Wn) of the switching elements of the second inverter 22 are parallelly connected to each other in bridge configuration.

The controller 40 is connected to both positive and negative terminals of the low-voltage battery 42, and capable of operating based on an output voltage of the low-voltage battery 42. For example, the controller 40 is essentially comprised of a microcomputer circuit. The controller 40 is connected to an external control circuit EC, for inputting, to the controller 40, first request torque Trq*1 and second request torque Trq*2 for the respective first and second MGs 10 and 20. For example, an electronic control unit (ECU), which is higher in hierarchy than the controller 40, can be used as the external control circuit EC if the controllers are arranged in a hierarchical relationship.

The controller 40 controls on and off switching operations of the switching elements Sc# of the booster converter 30, on and off switching operations of the switching elements S1*# of the first inverter 12, and on and off switching operations of the switching elements S2*# of the second inverter 22. These controls adjust torque, as an example of a controlled variable, generated by each of the first and second motor generators MG10- and 20 to match with corresponding one of the first request torque Trq*1 and the second request torque Trq*2.

Specifically, the controller 40 generates drive signals g1*# for the respective switching elements S1*# of the first inverter 12. The drive signals g1*p and the drive signals g1*n are complementary signals to each other. The controller 40 sends the drive signals g1*# to the gates of the respective switching elements S1*# via drivers. This cyclically performs complementary on and off operations of each of the switching elements S1*#.

The controller 40 also generates drive signals g2*# for the respective switching elements S2*# of the second inverter 22. The drive signals g2*p and the drive signals g2*n are complementary signals to each other. The controller 40 sends drive signals g2*# to the gates of the respective switching elements S2*# via drivers. This cyclically performs alternate on and off operations of each of the switching elements S2*#.

Additionally, the controller 40 generates drive signals gc# for the respective switching elements Sc*# of the booster converter 30. The drive signal gcp and the drive signal gcn are complementary signals to each other. The controller 40 sends the drive signals gcp and gcn to the gates of the respective switching elements Scp and Scn via drivers. This cyclically performs alternate on and off operations of each of the switching elements Sc#.

Note that the drivers included in the controller 40 for driving the upper- and lower-arm booster switching elements Sc∩ will be referred to as upper- and lower-arm booster drivers Drcp and Drcn. The drivers included in the controller 40 for driving the *-phase upper- and lower-arm switching elements S1*p and S1*n of the first inverter 12 will be referred to as *-phase upper- and lower-arm drivers Dr1*p and Dr1*n. The drivers included in the controller 40 for driving the *-phase upper- and lower-arm switching elements S2*p and S2*n of the second inverter 22 will be referred to as *-phase upper- and lower-arm drivers Dr2*p and Dr2*n.

The low-voltage battery 42, which serves as, for example, an auxiliary battery, has the output voltage lower than the output voltage of the high-voltage battery 50. For example, a lead-acid storage battery can be used as the low-voltage battery 42.

The interface 44 enables a high-voltage system comprised of the high-voltage battery 50, the first and second inverters 12 and 22, the booster converter 30, and the first and second MGs 10 and 20 to communicate with a low-voltage system comprised of the low-voltage battery 42 and the controller 40 while electrically isolating between the high- and low-voltage systems.

For example, the interface 44 includes electrical insulating members, such as photocouplers, provided for the respective switching elements Sc#, S1*#, and S2*#. Specifically, each of the photocouplers is configured to enable the controller 40 to control each of the a corresponding one of the switching elements Sc#, S1*#, and S2*# while establishing electrical insulation between the controller 40 and a corresponding one of the switching elements Sc#, S1*#, and S2*#.

The high voltage system has a reference voltage level, i.e. a reference potential, VstH to which the potential at the negative terminal of the high-voltage battery 50 is set. The low voltage system also has a reference voltage level, i.e. a reference potential, VstL to which the intermediate potential between the potential at the positive terminal of the high-voltage battery 12 and that at the negative terminal thereof is set; the intermediate potential is set to the potential at the body of the hybrid vehicle.

Next, an example of the structure of the controller 40 according to the first embodiment will be described in detail hereinafter.

Referring to FIG. 1, the controller 40 includes a first control circuit 41 for controlling the first inverter 12 and the booster converter 30, and a second control circuit 43 for controlling the second inverter 22.

Figure 2:
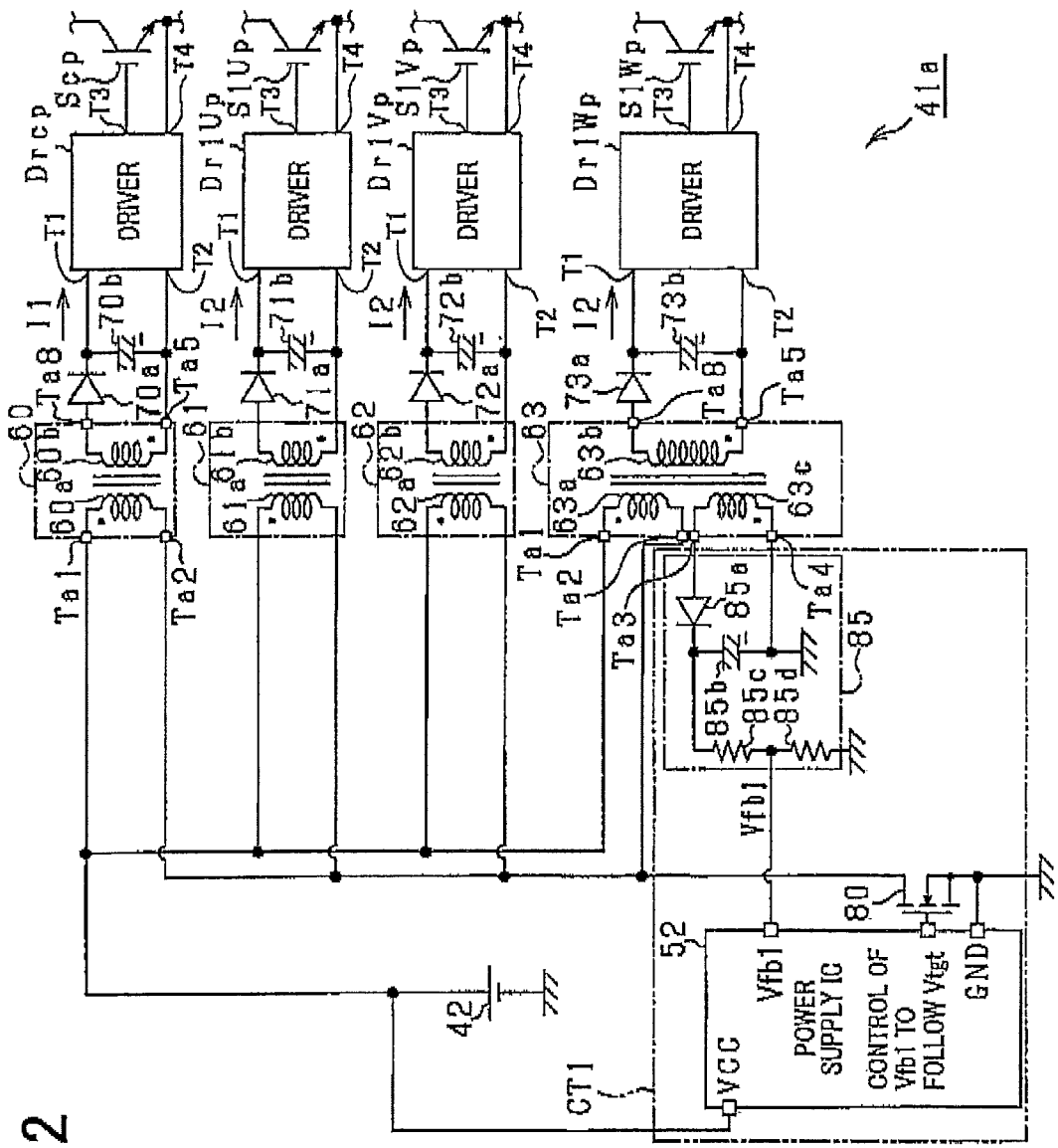
FIG. 2 is a circuit diagram schematically illustrating an example of an upper-arm power supply circuit of a first control circuit illustrated in FIG. 1.

The first control circuit 41 includes an upper-arm power supply circuit 41a and a first power-supply control unit CT1 (see FIG. 2). The upper-arm power supply circuit 41a controls the upper-arm switching elements Dcp and D1*p of the booster converter 30 and the first inverter 12. The first power-supply control circuit CT1 controls the upper-arm power supply circuit 41a.

Figure 3:
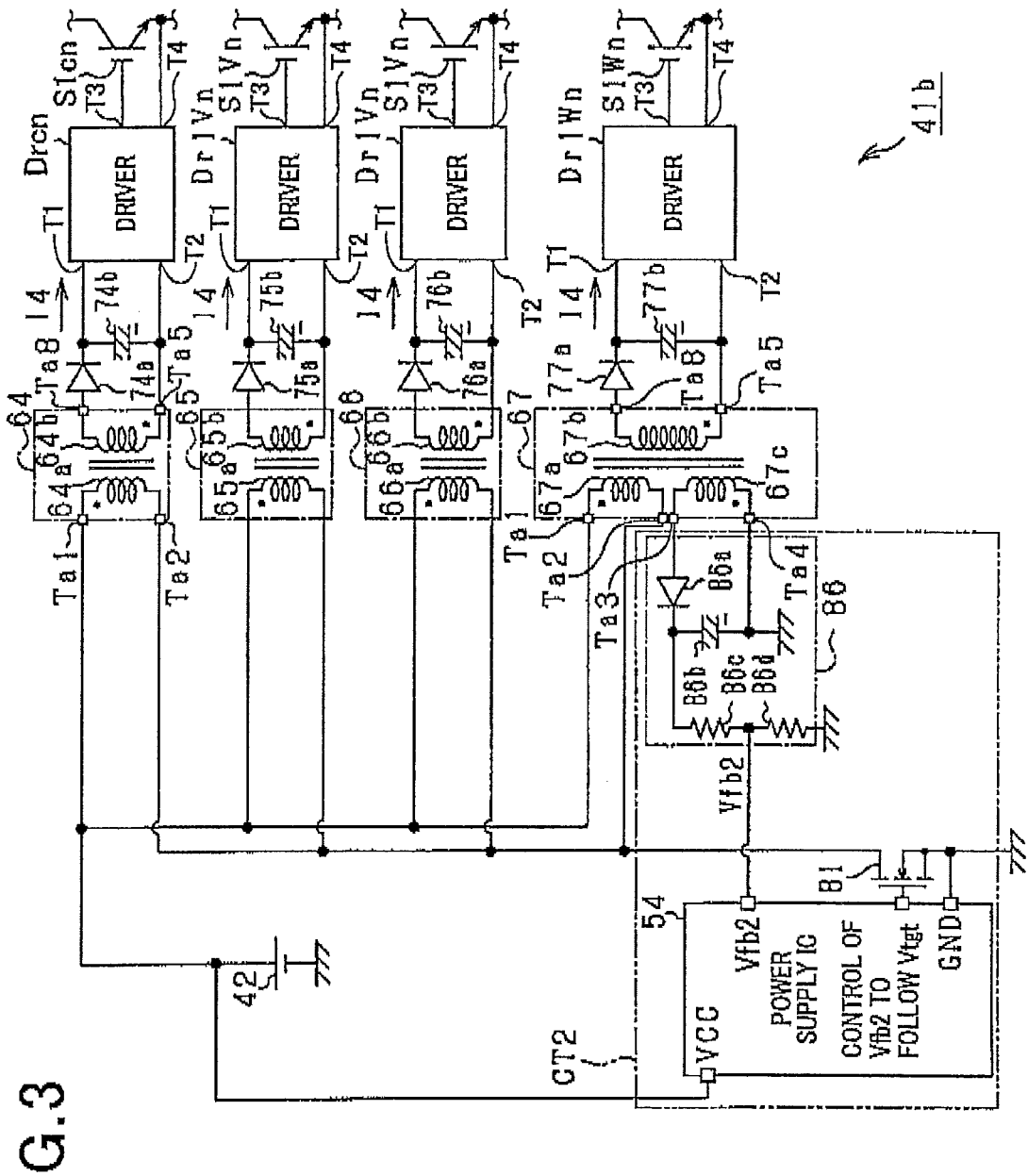
FIG. 3 is a circuit diagram schematically illustrating an example of a lower-arm power supply circuit of a second control circuit illustrated in FIG. 1.

The first control circuit 41 also includes a lower-arm power supply circuit 41b and a second power-supply control unit CT2 (see FIG. 3). The lower-arm power supply circuit 41b controls the lower-arm switching elements Dcn and D1*n of the booster converter 30 and the first inverter 12. The second power-supply control circuit CT2 controls the lower-arm power supply circuit 41b.

Similarly, the second control circuit 43 includes an upper-arm power supply circuit 43a and a third power-supply control unit CT3 (see FIG. 4B). The upper-arm power supply circuit 43a controls the upper-arm switching elements D2*p of the second inverter 22. The third power-supply control circuit CT3 controls the upper-arm power supply circuit 43a.

The second control circuit 43 also includes a lower-arm power supply circuit 43b and a fourth power-supply control unit CT4 (see FIG. 4B). The lower-arm power supply circuit 43b controls the lower-arm switching elements D2*n of the second inverter 22. The fourth power-supply control circuit CT4 controls the lower-arm power supply circuit 43b.

The first control circuit 41 controls individually the switching elements S1*# of the first inverter 12, and the second control circuit 43 controls individually the switching elements S2*# of the second inverter 22.

Next, examples of the structures of the upper- and lower-arm power supply circuits 41a and 41b are described in detail with reference to FIGS. 2 and 3.

Referring to FIG. 2, the upper-arm power supply circuit 41a includes a plurality of upper-arm transformers, a plurality of upper-arm diodes, and a plurality of upper-arm capacitors. The number of the upper-arm transformers, the number of the upper-arm diodes, and the number of the upper-arm capacitors match with the number of the upper-arm switching elements Scp, S1Up, S1Vp, and S1Wp. Thus, the upper-arm power supply circuit 41a according to the first embodiment includes four upper-arm transformers 60 to 63, four upper-arm diodes 70a to 73a, and four upper-arm capacitors 70b to 73b.

The upper-arm power supply circuit 41a also includes the upper-arm booster driver Drcp and the *-phase upper-arm drivers Dr1*p.

Each of the upper-arm transformers 60 to 63 is provided for a corresponding one of the upper-arm switching elements Scp and S1*p.

Specifically, the upper-arm transformer 60 is connected to the upper-arm booster driver Drcp for driving the upper-arm booster switching element Scp. The upper-arm transformer 60 supplies a driving voltage to the upper-arm booster driver Drcp.

The upper-arm transformer 61 is connected to the U-phase upper-arm driver Dr1Up for driving the upper-arm switching element S1Up.

The upper-arm transformer 61 supplies a driving voltage to the U-phase upper-arm driver Dr1Up.

The upper-arm transformer 62 is connected to the V-phase upper-arm driver Dr1Vp for driving the upper-arm switching element S1Vp. The upper-arm transformer 62 supplies a driving voltage to the V-phase upper-arm driver Dr1Vp.

The upper-arm transformer 63 is connected to the W-phase upper-arm driver Dr1Wp for driving the upper-arm switching element S1Wp. The upper-arm transformer 63 supplies a driving voltage to the W-phase upper-arm driver Dr1Wp.

The upper-arm transformer 60 has terminals Ta1, Ta2, Ta5, and Ta8, and includes a primary coil 60a and a secondary coil 60b magnetically coupled to the primary coil 60a. The upper-arm transformer 61 has terminals Ta1, Ta2, Ta5, and Ta8, and includes a primary coil 61a and a secondary coil 61b magnetically coupled to the primary coil 61a, The upper-arm transformer 62 has terminals Ta1, Ta2, Ta5, and Ta8, and includes a primary coil 62a and a secondary coil 62b magnetically coupled to the primary coil 62a. The upper-arm transformer 63 has terminals Ta1, Ta2, Ta5, and Ta8, and includes a primary coil 63a and a secondary coil 63b magnetically coupled to the primary coil 63a.

Each of the primary coils 60a to 63a has first and second opposite ends corresponding to the terminals Ta1 and Ta2. The primary coils 60a to 63a are connected in parallel to each other via their first and second ends (terminals) Ta1 and Ta2 to constitute a parallel connection coil member having first and second opposite ends. The positive terminal of the low-voltage battery 42 is connected to the first end, i.e. the terminal Ta1 of the primary coil 60a, of the parallel connection coil member. The negative terminal of the low-voltage battery 42 is connected to the second end, i.e. the terminal Ta2 of the primary coil 63a, of the parallel connection coil member via a voltage-controlled switching element 80 of the first power-supply control unit CT1 described later. An N-channel MOSFET is for example used as the voltage-controlled switching element 80.

The secondary coil 60b of the upper-arm transformer 60 has first and second opposite ends corresponding to the respective terminals Ta8 and Ta5 of the upper-arm transformer 60. The first end Ta8 of the secondary coil 60b is connected to the anode of the upper-arm diode 70a. The cathode of the upper-arm diode 70a is connected to a first terminal T1 of the upper-arm booster driver Drcp and to a first electrode of the upper-arm capacitor 70b. The second end Ta5 of the secondary coil 60b is connected to a second electrode of the upper-arm capacitor 70b and to a second terminal T2 of the upper-arm booster driver Drcp. The upper-arm diode 70a and the upper-arm capacitor 70c serve as, for example, a smoothing circuit. The upper-arm booster driver Drcp also has third and fourth terminals T3 and T4 connected to the respective gate and emitter of the booster upper-arm switching element Scp.

Each of the secondary coils 61b to 63b has first and second opposite ends corresponding to the respective terminals Ta8 and Ta5. The first end Ta8 of each of the secondary coils 61b to 63b is connected to the anode of a corresponding one of the upper-arm diodes 71a to 73a. The cathode of each of the upper-arm diodes 71a to 73a is connected to a first terminal T1 of a corresponding one of the U-, V-, and W-phase upper-arm drivers Dr1*p and to a first electrode of a corresponding one of the upper-arm capacitors 71b to 73b, The second end Ta5 of each of the secondary coils 61b to 63b is connected to a second electrode of a corresponding one of the upper-arm capacitors 71b to 73b and to a second terminal T2 of a corresponding one of the U-, V-, and W-phase upper-arm drivers Dr1*p, Each of the *-phase upper-arm drivers Dr1*p also has third and fourth terminals T3 and T4 connected to the respective gate and emitter of a corresponding one of the *-phase upper-arm switching element S1*p.

The upper-arm transformer 63 specially has terminals Ta3 and Ta4, and specially includes a feedback coil 63c magnetically coupled to the secondary coil 63b. The feedback coil 63c, which serves as a voltage detection coil, has first and second opposite ends corresponding to the respective terminals Ta3 and Ta4. The feedback coil 63c is connected to the first power-supply control unit CT1 via the terminals Ta3 and Ta4. Each of the upper-arm diodes 71a to 73a and a corresponding one of the upper-arm capacitors 71c to 73c serve as, for example, a smoothing circuit.

The first power-supply control unit CT1 includes a feedback circuit 85, a power-supply IC 52, and the voltage-controlled switching element 80. The power-supply IC 52 has a terminal VCC connected to the positive terminal of the low-voltage battery 42, and the power-supply IC 52 operates based on the output voltage of the low-voltage battery 42.

The feedback circuit 85 includes a detection diode 85a, a detection capacitor 85b having first and second opposite electrodes, and resistors 85c and 85d each having first and second opposite ends. The first end, i.e. the terminal Ta3, of the feedback coil 63c is connected to the anode of the detection diode 85a. The cathode of the detection diode 85a is connected to the first electrode of the detection capacitor 85b and to the first end of the resistor 85c. The second end of the resistor 85c is connected to the first end of the resistor 85d, resulting in a series-connected resistor member (85c, 85d). The second end of the resistor 85d is connected to a common signal ground of the first power-supply control unit CT1 to which the second electrode of the detection capacitor 85b and the second end, i.e. the terminal Ta4, of the feedback coil 63c is connected. The detection diode 85a and the detection capacitor 85b serve as, for example, a smoothing circuit (85a, 85b).

The power-supply IC 52 is comprised of, for example, a single IC, and has a ground terminal GND connected to the common signal ground of the first power-supply control unit CT1. The power-supply IC 52 is connected to the gate of the voltage-controlled switching element 80.

Specifically, complementary turning on and off the voltage-controlled switching element 80 by the power-supply IC 52 generates an AC pulse voltage across each of the primary coils 60a to 63a. The AC pulse voltage generated across each of the primary coils 60a to 63a induces an AC pulse voltage across a corresponding one of the secondary coils 60b to 63b. The turns ratio representing the number of turns of each of the secondary coils 60b to 63b to the number of turns of a corresponding one of the primary coils 60a to 63a can be variably set to a value. This is capable of changing the amplitude of the AC pulse voltage induced across each of the secondary coils 60b to 63b.

The AC pulse voltage induced across each of the secondary coils 60b to 63b is converted by a corresponding one of the smoothing circuits into a smoothed DC voltage. The smoothed DC voltage is sent from each of the smoothing circuits to a corresponding one of the drivers Drcp, Dr1Up, Dr1Vp, and Dr1Wp via a corresponding one of the smoothing circuits. This stably drives each of the drivers Drcp, Dr1Up, Dr1Vp, and Dr1Wp.

The AC pulse voltage induced across the secondary coil 63b includes an AC pulse voltage across the feedback coil 63c of the feedback circuit 85. That is, the feedback circuit 85 configured above is capable of rectifying the AC pulse voltage induced across the feedback coil 63c into a DC voltage. Specifically, the AC pulse voltage induced across the feedback coil 63c is converted by the smoothing circuit (85a, 85b) into a smoothed DC voltage. The smoothed DC voltage is sent to the series-connected resistor member (85c, 85d). The series-connected resistor member (85c, 85d) serves as a voltage divider to divide the smoothed DC voltage into a divided voltage, i.e. a feedback voltage, Vfb1. The feedback voltage Vfb1 is output from the feedback circuit 85 to the power-supply IC 52 via a feedback terminal Tfb1 of the feedback circuit 85.

To the power-supply IC 52, a target voltage Vtgt for the feedback voltage Vfb1 is sent from another external control circuit, such as the external control circuit EC. The power-supply IC 52 controls complementary on and off operations of the voltage-controlled switching element 80, thus feedback controlling a value of the feedback voltage Vfb1 to match with the target voltage Vtgt.

Referring to FIG. 3, the lower-arm power supply circuit 41b includes a plurality of lower-arm transformers, a plurality of lower-arm diodes, and a plurality of lower-arm capacitors. The number of the lower-arm transformers, the number of the lower-arm diodes, and the number of the lower-arm capacitors match with the number of the lower-arm switching elements Scn, S1Un, S1Vn, and S1Wn. Thus, the lower-arm power supply circuit 41b according to the first embodiment includes four lower-arm transformers 64 to 67, four lower-arm diodes 74a to 77a, and four lower-arm capacitors 74b to 77b.

The lower-arm power supply circuit 41b also includes the lower-arm booster driver Drcn and the *-phase lower-arm drivers Dr1*n.

Each of the lower-arm transformers 64 to 67 is provided for a corresponding one of the lower-arm switching elements Son and S1*n.

Specifically, the lower-arm transformer 64 is connected to the lower-arm booster driver Drcn for driving the lower-arm booster switching element Scn. The lower-arm transformer 64 supplies a driving voltage to the lower-arm booster driver Drcn.

The lower-arm transformer 65 is connected to the U-phase to lower-arm driver Dr1Un for driving the lower-arm switching element S1Un. The lower-arm transformer 65 supplies a driving voltage to the U-phase lower-arm driver Dr1Un.

The lower-arm transformer 66 is connected to the V-phase lower-arm driver Dr1Vn for driving the lower-arm switching element SLVn. The lower-arm transformer 66 supplies a driving voltage to the V-phase lower-arm driver Dr1Vn.

The lower-arm transformer 67 is connected to the W-phase lower-arm driver Dr1Wn for driving the lower-arm switching element S1Wn. The lower-arm transformer 67 supplies a driving voltage to the W-phase lower-arm driver Dr1Wn.

The lower-arm transformer 64 has terminals Ta1, Ta2, Ta5, and Ta8, and includes a primary coil 64a and a secondary coil 64b magnetically coupled to the primary coil 64a. The lower-arm transformer 65 has terminals Ta1, Ta2, Ta5, and Ta8, and includes a primary coil 65a and a secondary coil 65b magnetically coupled to the primary coil 65a. The lower-arm transformer 66 has terminals Ta1, Ta2, Ta5, and Ta8, and includes a primary coil 66a and a secondary coil 66b magnetically coupled to the primary coil 66a. The upper-arm transformer 67 has terminals Ta1, Ta2, Ta5, and Ta8, and includes a primary coil 67a and a secondary coil 67b magnetically coupled to the primary coil 67a.

Each of the primary coils 64a to 67a has first and second opposite ends corresponding to the terminals Ta1 and Ta2. The primary coils 64a to 67a are connected in parallel to each other via their first and second ends (terminals) Ta1 and Ta2 to constitute a parallel connection coil member having first and second opposite ends. The positive terminal of the low-voltage battery 42 is connected to the first end, i.e. the terminal Ta1 of the primary coil 64a, of the parallel connection coil member. The negative terminal of the low-voltage battery 42 is connected to the second end, i.e. the terminal Ta2 of the primary coil 67a, of the parallel connection coli member via a voltage-controlled switching element 81 of the second power-supply control unit CT2 described later. An N-channel MOSFET is for example used as the voltage-controlled switching element 81.

The secondary coil 64b of the lower-arm transformer 64 has first and second opposite ends corresponding to the respective terminals Ta8 and Ta5 of the lower-arm transformer 64. The first end Ta8 of the secondary coil 64b is connected to the anode of the lower-arm diode 74a. The cathode of the lower-arm diode 74a is connected to a first terminal T1 of the lower-arm booster driver Drcn and to a first electrode of the lower-arm capacitor 74b. The second end Ta5 of the secondary coil 6fb is connected to a second electrode of the lower-arm capacitor 74b and to a second terminal T2 of the lower-arm booster driver Drcn. The lower-arm diode 74a and the lower-arm capacitor 74c serve as, for example, a smoothing circuit. The lower-arm booster driver Drcn also has third and fourth terminals T3 and T4 connected to the respective gate and emitter of the booster lower-arm switching element Scn.

Each of the secondary coils 65b to 67b has first and second opposite ends corresponding to the respective terminals Ta8 and Ta5. The first end Ta8 of each of the secondary coils 65b to 67b is connected to the anode of a corresponding one of the lower-arm diodes 75a to 77a. The cathode of each of the lower-arm diodes 75a to 77a is connected to a first terminal T1 of a corresponding one of the U-, V-, and W-phase lower-arm drivers Dr1*n and to a first electrode of a corresponding one of the lower-arm capacitors 75b to 77b. The second end Ta5 of each of the secondary coils 65b to 67b is connected to a second electrode of a corresponding one of the lower-arm capacitors 75b to 77b and to a second terminal T2 of a corresponding one of the U-, V-, and W-phase lower-arm drivers Dr1*n. Each of the *-phase lower-arm booster drivers Dr1*n also has third and fourth terminals T3 and T4 connected to the respective gate and emitter of a corresponding one of the *-phase lower-arm switching elements S1*n.

The lower-arm transformer 67 specially has terminals Ta3 and Ta4, and specially includes a feedback coil 67c magnetically coupled to the secondary coil 67b. The feedback coil 67c, which serves as a voltage detection coil, has first and second opposite ends corresponding to the respective terminals Ta3 and Ta4. The feedback coil 67c is connected to the second power-supply control unit CT2 via the terminals Ta3 and Ta4. Each of the lower-arm diodes 74a to 77a and a corresponding one of the lower-arm capacitors 74c to 77c serve as, for example, a smoothing circuit, The second power-supply control unit CT2 includes a feedback circuit 86, a power-supply IC 54, and the voltage-controlled switching element 81. The power-supply IC 54 has a terminal VCC connected to the positive terminal of the low-voltage battery 42, and the power-supply IC 54 operates based on the output voltage of the low-voltage battery 42.

The feedback circuit 86 includes a detection diode 86a, a detection capacitor 86b having first and second opposite electrodes, and resistors 86c and 86d each having first and second opposite ends. The first end, i.e. the terminal Ta3, of the feedback coil 67c is connected to the anode of the detection diode 86a. The cathode of the detection diode 86a is connected to the first electrode of the detection capacitor 86b and to the first end of the resistor 86c. The second end of the resistor 86c is connected to the first end of the resistor 86d, resulting in a series-connected resistor member (86c, 86d). The second end of the resistor 86d is connected to a common signal ground of the second power-supply control unit CT2 to which the second electrode of the detection capacitor 86b and the second end, i.e. the terminal Ta4, of the feedback coil 67c is connected. The detection diode 86a and the detection capacitor 86b serve as, for example, a smoothing circuit (86a, 86b).

The power-supply IC 54 is comprised of, for example, a single IC, and has a ground terminal GND connected to the common signal ground of the second power-supply control unit CT2. The power-supply IC 54 is connected to the gate of the voltage-controlled switching element 81.

Specifically, complementary turning on and off the voltage-controlled switching element 81 by the power-supply IC 54 generates an AC pulse voltage across each of the primary coils 64a to 67a. The AC pulse voltage generated across each of the primary coils 64a to 67a induces an AC pulse voltage across a corresponding one of the secondary coils 64b to 67b. The turns ratio representing the number of turns of each of the secondary coils 64b to 67b to the number of turns of a corresponding one of the primary coils 64a to 67a can be variably set to a value. This is capable of changing the amplitude of the AC pulse voltage induced across each of the secondary coils 64b to 67b.

The AC pulse voltage induced across each of the secondary coils 64b to 67b is converted by a corresponding one of the smoothing circuits into a smoothed DC voltage. The smoothed DC voltage is sent from each of the smoothing circuits to a corresponding one of the drivers Drcn, Dr1Un, Dr1Vn, and Dr1Wn via a corresponding one of the smoothing circuits. This stably drives each of the drivers Drcn, Dr1Un, Dr1Vn, and Dr1Wn.

The AC pulse voltage induced across the secondary coil 67b includes an AC pulse voltage across the feedback coil 67c of the feedback circuit 86. That is, the feedback circuit 86 configured above is capable of rectifying the AC pulse voltage induced across the feedback coil 67c into a DC voltage. Specifically, the AC pulse voltage induced across the feedback coil 67c is converted by the smoothing circuit (86a, 86b) into a smoothed DC voltage. The smoothed DC voltage is sent to the series-connected resistor member (86c, 86d). The series-connected resistor member (86c, 86d) serves as a voltage divider to divide the smoothed DC voltage into a divided voltage, i.e. a feedback voltage, Vfb2. The feedback voltage Vfb2 is output from the feedback circuit 86 to the power-supply IC 54 via a feedback terminal Tfb2 of the feedback circuit 86.

To the power-supply IC 54, the target voltage Vtgt for the feedback voltage Vfb1 is sent from another external control circuit, such as the external control circuit EC. The power-supply IC 54 controls complementary on and off operations of the voltage-controlled switching element 81, thus feedback controlling a value of the feedback voltage Vfb2 to match with the target voltage Vtgt.

As illustrated in FIG. 4B, the upper-arm power supply circuit 43a for controlling the second inverter 22 includes three upper-arm transformers 90 to 92, unillustrated three upper-arm diodes, unillustrated upper-arm capacitors, the *-phase upper-arm drivers Dr2*p, and the third power-supply control unit CT3. These components of the upper-arm power supply circuit 43a are substantially identical to those of the upper-arm power supply circuit 41a. The descriptions of the components of the upper-arm power supply circuit 43a are therefore omitted.

Additionally, the upper-arm power supply circuit 43a for controlling the second inverter 22 includes three lower-arm transformers 93 to 95, unillustrated three lower-arm diodes, unillustrated lower-arm capacitors, the *-phase lower-arm drivers Dr2*n, and the fourth power-supply control unit CT4 (see FIG. 4B). These components of the lower-arm power supply circuit 43b are substantially identical to those of the lower-arm power supply circuit 41b. The descriptions of the components of the lower-arm power supply circuit 43b are therefore omitted.

Figure 4A:
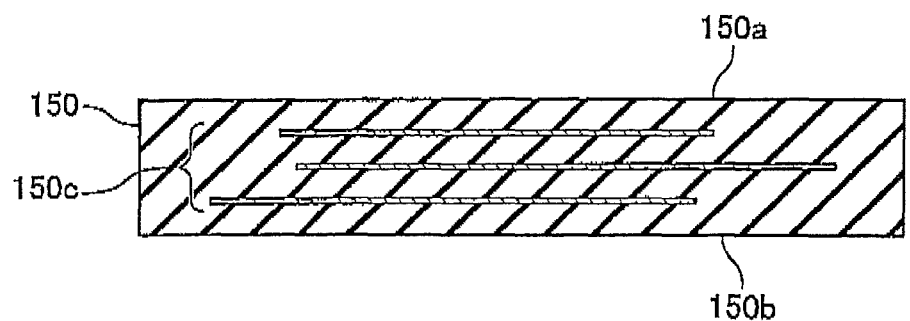
FIG. 4A is a vertical cross-sectional view of a board according to the first embodiment.

In particular, at least the first control circuit 41 for controlling the first inverter 12 and the second control circuit 43 for controlling the second inverter 22 of the controller 40 are installed in a board, i.e. a substrate, 150 illustrated in FIG. 4B, For example, the board 150 is designed as a rectangular plate-like multilayer board, i.e. a rectangular-parallelepiped multilayer board. Specifically, referring to FIG. 4A, the board 150 has a first outer layer corresponding to a first outer mount surface 150a, a second outer layer corresponding to a second outer mount surface 150b opposite to the first outer mount surface 150a, and a plurality of, i.e. three or more, internal layers 150c between the first and second outer layers 150a and 150b. A single-layer board having a first outer layer corresponding to a first outer mount surface and a second outer layer corresponding to a second outer mount surface opposite to the first mount surface without having internal layers can be used as the board 150.

Next, how the components of the upper-arm power supply circuit 41a and the first power-supply control unit CT1 of the first control circuit 41 are arranged on and/or in the board 150 will be described hereinafter with reference to FIG. 4B. Note that how the components of the lower-arm power supply circuit 43a and the second power-supply control unit CT2 of the second control circuit 43 are arranged on and/or in the board 150 will be omitted. This is because the arrangement of the components of the lower-arm power supply circuit 43a and the second power-supply control unit CT2 on and/or in the board 150 is substantially similar to the arrangement of the components of the upper-arm power supply circuit 41a and the first power-supply control unit CT1 on and/or in the board 150.

FIG. 4B illustrates arrangement of the upper-arm transformers 90 to 92, the *-phase upper-arm drivers Dr2*p, the third power-supply control unit CT3, the lower-arm transformers 93 to 95, the *-phase lower-arm drivers Dr2*n, and the fourth power-supply control unit CT4. In particular, the power supply ICs of the third and fourth power-supply control units CT3 and CT4 are unillustrated in FIG. 4B.

Specifically, the components of the first control circuit 41 are mounted on a first half area, i.e. a left half area, of the first outer mount surface 150a of the board 150 in the longitudinal direction, and those of the second control circuit 43 are mounted on a second half area, i.e. a right half area, of the first outer mount surface 150a when viewed from the front of the first outer mount surface 150a.

The first power-supply control unit CT1, the upper-arm transformers 60 to 63, and the upper-arm drivers Drcp and Dr1*p are sequentially mounted on the first outer mount surface 150a in this order from a first longitudinal edge 150E1 in the lateral direction of the first outer mount surface 150a toward a middle portion of the first outer mount surface 150a. Similarly, the second power-supply control unit CT2, the lower-arm transformers 64 to 67, and the lower-arm drivers Drcn and Dr1*n are sequentially mounted on the first outer mount surface 150a in this order from a second longitudinal edge 150E2 in the lateral direction of the first outer mount surface 150a toward the middle portion of the first outer mount surface 150a.

The upper-arm power supply circuit 41a includes a booster upper-arm connector Tcp, a U-phase upper-arm connector T1Up, a V-phase upper-arm connector T1Vp, and a W-phase upper-arm connector T1Wp mounted on the first half area of the first outer mount surface 150a adjacent to the respective upper-arm drivers Drcp, Dr1Up, Dr1Vp, and Dr1Wp. Similarly, the lower-arm power supply circuit 41b includes a booster lower-arm connector Tcn, a U-phase lower-arm connector T1Un, a V-phase lower-arm connector T1Vn, and a W-phase lower-arm connector T1Wn mounted on the first half area of the first outer mount surface 150a adjacent to the respective lower-arm drivers Drcn, Dr1Un, Dr1Vn, and Dr1Wn.

Specifically, the booster upper-arm connector Tcp, U-phase upper-arm connector T1Up, V-phase upper-arm connector T1Vp, and W-phase upper-arm connector T1Wp are juxtaposed to the respective booster lower-arm connector Tcn, U-phase lower-arm connector T1Un, V-phase lower-arm connector T1Vn, and W-phase lower-arm connector T1Wn.

The booster upper-arm connector Tcp connects the booster upper-arm driver Drcp to the corresponding upper-arm booster switching element Scp of the booster module Mc. Each of the *-phase upper-arm connectors T1*p connects a corresponding one of the *-phase upper-arm drivers Dr1*p to a corresponding one of the upper-arm switching elements S1*p of a corresponding one of the *-phase switching modules M1*.

Similarly, the booster lower-arm connector Tcn connects the booster lower-arm driver Drcn to the corresponding lower-arm booster switching element Scn of the booster module Mc. Each of the *-phase lower-arm connectors T1*n connects a corresponding one of the *-phase lower-arm drivers Dr1*n to a corresponding one of the lower-arm switching elements S1*n of a corresponding one of the *phase switching modules M1*.

The booster upper-arm connector Tcp, U-phase upper-arm connector T1Up, V-phase upper-arm connector T1Vp, and W-phase upper-arm connector T1Wp are aligned in, for example, the longitudinal direction of the board 150 when viewed from the front of the first outer mount surface 150a. The booster upper-arm connector Tcp, U-phase upper-arm connector T1Up, V-phase upper-arm connector T1Vp, and W-phase upper-arm connector T1Wp are arranged at the middle portion in the lateral direction of the board 150 perpendicular to the longitudinal direction corresponding to the direction of alignment of these connectors Tcp and T1*p.

Similarly, the booster lower-arm connector Tcn, U-phase lower-arm connector T1Un, V-phase lower-arm connector T1Vn, and W-phase lower-arm connector T1Wn are aligned in, for example, the longitudinal direction of the board 150 when viewed from the front of the first outer mount surface 150a The booster lower-arm connector Tcn, U-phase lower-arm connector T1Un, V-phase lower-arm connector T1Vn, and W-phase lower-arm connector T1Wn are disposed adjacent to the respective booster upper-arm connector Tcp, U-phase upper-arm connector T1Up, V-phase upper-arm connector T1Vp, and W-phase upper-arm connector T1Wp while facing the respective connectors Tcp, T1Up, T1Vp, and T1Wp.

For example, the booster module Mc is mounted on the second outer mount surface 150b. The gate and emitter of the booster upper-arm switching element Scp of the booster module Mc are connected to the booster upper-arm connector Tcp to which the corresponding third and fourth terminals T3 and T4 of the booster upper-arm driver Drcp are connected. This causes the booster upper-arm connector Tcp to connect between the gate and emitter of the booster upper-arm switching element Scp and the respective third and fourth terminals T3 and T4 of the booster upper-arm driver Drcp. Similarly, the gate and emitter of the booster lower-arm switching element Son of the booster module Mc are connected to the booster lower-arm connector Tcn to which the corresponding third and fourth terminals T3 and T4 of the booster lower-arm driver Drcn are connected. This causes the booster lower-arm connector Tcn to connect between the gate and emitter of the booster lower-arm switching element Scn and the respective third and fourth terminals T3 and T4 of the booster lower-arm driver Drcn.

Additionally, for example, each of the *-phase switch modules M1* is mounted on the second outer mount surface 150b. The gate and emitter of each of the *-phase upper-arm switching elements S1*p of the corresponding switch module M1* are connected to a corresponding one of the *-phase upper-arm connectors T1*p to which the third and fourth terminals T3 and T4 of a corresponding one of the *-phase upper-arm drivers Dr1*p are connected. This causes each of the *-phase upper-arm connectors T1*p to connect between the gate and emitter of a corresponding one of the *-phase upper-arm switching elements S1*p and the respective third and fourth terminals T3 and T4 of a corresponding one of the *-phase upper-arm drivers Dr1*p. Similarly, the gate and emitter of each of the *-phase lower-arm switching elements S1*n of the corresponding switch module M1* are connected to a corresponding one of the *-phase lower-arm connectors T1*n to which the third and fourth terminals T3 and T4 of a corresponding one of the *-phase lower-arm drivers Dr1*n are connected. This causes each of the *-phase lower-arm connectors T1*n to connect between the gate and emitter of a corresponding one of the *-phase lower-arm switching elements S1*n and the respective third and fourth terminals T3 and T4 of a corresponding one of the *-phase lower-arm drivers Dr1*n.

As described above, the booster lower-arm connector Tcn, U-phase lower-arm connector T1Un, V-phase lower-arm connector T1Vn, and W-phase lower-arm connector T1Wn are located on the first outer mount surface 150a at a first side with respect to the respective connectors Tcp, T1Up, T1Vp, and T1Wp in the lateral direction of the board 150; the first side represents the lower side in FIG. 4B. The upper-arm transformers 60 to 63 are located on the first outer mount surface 150a at a second side with respect to the respective connectors Tcp, T1Up, T1Vp, and T1Wp in the lateral direction of the board 150 when viewed from the front of the first outer mount surface 150a; the second side, which represents the upper side in FIG. 4B, is opposite to the first side. The upper-arm transformers 60 to 63 are aligned substantially parallel to the direction of alignment of the connectors Tcp, T1Up, T1Vp, and T1Wp.

The first power-supply control unit CT1 is located on the first outer mount surface 150a at the second side with respect to the transformers 60 to 63 in the lateral direction of the board 150 when viewed from the front of the first outer mount surface 150a. The upper-arm transformers 60 to 63 are located on the first outer mount surface 150a while the respective terminals Ta1 and Ta2 are adjacent to the first power-supply control unit CT1.

The upper-arm drivers, Drcp, Dr1Up, Dr1Vp, and Dr1Wp are disposed on the first outer mount surface 150a between the respective connectors Tcp, Tc1UP, Tc1Vp, and Tc1Wp and the respective transformers 60, 61, 62, and 63. The upper-arm drivers Drcp, Dr1Up, Dr1Vp, and Dr1Wp are aligned substantially parallel to the direction of alignment of the connectors Tcp, T1Up, T1Vp, and T1Wp.

The lower-arm transformers 64 to 67 are located on the first outer mount surface 150a at the first side with respect to the respective connectors Tcn, T1Un, T1Vn, and T1Wn in the lateral direction of the board 150 when viewed from the front of the first outer mount surface 150a. The lower-arm transformers 64 to 67 are aligned substantially parallel to the direction of alignment of the connectors Tcn, T1Un, T1Vn, and T1Wn.

The second power-supply control unit CT2 is located on the first outer mount surface 150a at the first side with respect to the transformers 64 to 67 in the lateral direction of the board 150 when viewed from the front of the first outer mount surface 150a. The lower-arm transformers 64 to 67 are located on the first outer mount surface 150a while the respective terminals Ta1 and Ta2 are adjacent to the second power-supply control unit CT2.

The lower-arm drivers Drcn, Dr1Un, Dr1Vn, and Dr1Wn are disposed on the first outer mount surface 150a between the respective connectors Tcn, Tc1Un, Tc1Vn, and Tc1Wn and the respective transformers 64, 65, 66, and 67. The lower-arm drivers Drcn, Dr1Un, Dr1Vn, and Dr1Wn are aligned substantially parallel to the direction of alignment of the connectors Tcn, T1Un, T1Vn, and T1Wn.

A terminal 42a is mounted on the first half area of the first outer mount surface 150a, and located at the second side with respect to the connectors Tcp, T1Up, T1Vp, and T1Wp. The terminal 42a connects the positive terminal of the low-voltage battery 42 to the terminal VCC of the power-supply IC 52 and to the respective transformers 60 to 63. The terminal 42a enables electric power to be supplied from the low-voltage battery 42 to the power-supply IC 52 and to the respective transformers 60 to 63.

Similarly, a terminal 42b is mounted on the first half area of the first outer mount surface 150a, and located at the first side with respect to the connectors Tcn, T1Un, T1Vn, and T1Wn. The terminal 42b connects the positive terminal of the low-voltage battery 42 to the terminal VCC of the power-supply IC 54 and to the respective transformers 64 to 67. The terminal 42b enables electric power to be supplied from the low-voltage battery 42 to the power-supply IC 54 and to the respective transformers 64 to 67.

The feedback terminal Tfb1 of the feedback circuit 85 and the terminal Ta3 of the upper-arm transformer 63 are connected to each other by an electrical pattern Lfb1. The electrical pattern Lfb1 is comprised of a circuit pattern of part of the feedback circuit 85 and a wiring pattern formed on and/or in the board 150, and serves to transmit the feedback voltage Vfb1 from the feedback circuit 85 to the power-supply IC 52. Specifically, the electrical pattern Lfb1 is an electrical pattern from the terminal Ta3 of the upper-arm transformer 63 to the feedback terminal Tfb1 of the power-supply IC 52 via the feedback circuit 85.

Similarly, the feedback terminal Tfb2 of the feedback circuit 86 and the terminal Ta3 of the lower-arm transformer 67 are connected to each other by an electrical pattern Lfb2. The electrical pattern Lfb2 is comprised of a circuit pattern of part of the feedback circuit 86 and a wiring pattern formed on and/or in the board 150, and serves to transmit the feedback voltage Vfb2 from the feedback circuit 86 to the power-supply IC 54. Specifically, the electrical pattern Lfb2 is an electrical pattern from the terminal Ta3 of the lower-arm transformer 67 to the feedback terminal Tfb2 of the power-supply IC 54 via the feedback circuit 86.

The terminals Ta1 of all the upper-arm transformers 60 to 63 are connected to the terminal 42a connected to the positive terminal of the low-voltage battery 42 by a first wiring pattern L1, which consists of wiring paths, provided on and/or in the board 150 (see dashed lines L1 in FIG. 43). For example, the first wiring pattern is provided in a first region R1 on and in the board 150 to extend from the terminal 42a connected to the positive terminal of the low-voltage battery 42 to the terminal Ta1 of each of the upper-arm transformers 60 to 63 when viewed from the front of the first outer mount surface 150a.

The first region R1 is defined as a region on and in the board 150 sandwiched between the first power-supply control unit CT1 and the group of the aligned upper-arm transformers 60 to 63 when viewed from the front of the first outer mount surface 150a.

Similarly, the terminals Ta2 of all the upper-arm transformers 60 to 63 are connected to the voltage-controlled switching element 80 by a second wiring pattern L2, which consists of wiring paths, provided on and/or in the board 150 (see solid lines L2 in FIG. 4B). For example, the second wiring pattern L2 is provided in the first region on and in the board 150 to extend from the voltage-controlled switching element 80 to the terminal Ta2 of each of the upper-arm transformers 60 to 63 when viewed from the front of the first outer mount surface 150a.

Additionally, the terminals Ta1 of all the upper-arm transformers 64 to 67 are connected to the terminal 42a connected to the positive terminal of the low-voltage battery 42 by a third wiring pattern L3, which consists of wiring paths, provided on and/or in the board 150 (see dashed lines L3 in FIG. 4B). For example, the third wiring pattern L3 is provided in a second region R2 on and in the board 150 to extend from the terminal 42a connected to the positive terminal of the low-voltage battery 42 to the terminal Ta1 of each of the upper-arm transformers 64 to 67 when viewed from the front of the first outer mount surface 150a.

The second region R2 is defined as a region on and in the board 150 sandwiched between the second power-supply control unit CT2 and the group of the aligned upper-arm transformers 64 to 67 when viewed from the front of the first outer mount surface 150a.

Similarly, the terminals Ta2 of all the upper-arm transformers 64 to 67 are connected to the voltage-controlled switching element 81 by a fourth wiring pattern L4, which consists of wiring paths, provided on and/or in the board 150 (see solid lines L4 in FIG. 4B). For example, the fourth wiring pattern LA is provided in the second region on and in the board 150 to extend from the voltage-controlled switching element 81 to the terminal Ta2 of each of the upper-arm transformers 64 to 67 when viewed from the front of the first outer mount surface. 150a.

For example, the first wiring pattern L1, the second wiring pattern L2, and the electrical pattern Lfb1 are formed on different layers of the internal layers 150c of the board 150. Although intersections seem to be formed among the first wiring pattern L1, the second wiring pattern L2, and the electrical pattern Lfb1 when viewed from the front of the first outer layer surface 150a, the first wiring pattern L1, the second wiring pattern L2, and the electrical pattern Lfb1 are electrically separated at the corresponding intersections. This is similarly established for the third wiring pattern L3, the fourth wiring pattern L4, and the electrical pattern Lfb2.

The controller 40 of the motor-generator control system CS is configured such that the first and second power-supply control units CT1 and CT2 individually control the respective upper- and lower-arm power supply circuits 41a and 41b for the first inverter 12. The first power-supply control unit CT1 is arranged on and/or in the board 150 to be adjacent to the upper-arm power supply circuit 41a. Similarly, the second power-supply control unit CT2 is arranged on and/or in the board 150 to be adjacent to the lower-arm power supply circuit 41b.

The arrangement of the components of the upper- and lower-arm power-supply circuits 41a and 41b result in (1) The wiring paths included in the first and second wiring patterns L1 and L2, which extend from the first power-supply control unit CT1 to the primary coils 60a to 63a of the upper-arm transformers 60 to 63, each having a shorter length (2) The wiring paths included in the third and fourth wiring patterns L3 and L4, which extend from the second power-supply control unit CT2 to the primary coils 64a to 67a of the lower-arm transformers 64 to 67, each having a shorter length.

Similarly, the controller 40 of the motor-generator control system CS is configured such that the third and fourth power-supply control units CT3 and CT4 individually control the respective upper- and lower-arm power supply circuits 43a and 43b for the second inverter 22, The third power-supply control unit CT3 is arranged on and/or in the board 150 to be adjacent to the upper-arm power supply circuit 43a. Similarly, the fourth power-supply control unit CT4 is arranged on and/or in the board 150 to be adjacent to the lower-arm power supply circuit 43b, The arrangement of the components of the upper- and lower-arm power-supply circuits 43a and 43b result in (1) The wiring paths included in the first and second wiring patterns L1 and L2, which extend from the third power-supply control unit CT3 to the primary coils of the upper-arm transformers 90 to 93, each having a shorter length (2) The wiring paths included in the third and fourth wiring patterns L3 and L4, which extend from the fourth power-supply control unit CT4 to the primary coils of the lower-arm transformers 94 to 97, each having a shorter length.

In contrast, another arrangement of the components of the upper-arm power supply circuit 41a and the first power-supply control unit CT1 of the first control circuit 41 on and/or in the board 150 according to a comparative example of the first embodiment will be described hereinafter with reference to FIG. 5, Like reference characters and numerals are assigned to similar components illustrated in FIGS. 4B and 5 for convenience.

In particular, the comparative example is configured such that the first power-supply control unit CT1 controls both the upper- and lower-arm power supply circuits 41a and 41b for the first inverter 12. Similarly, the comparative example is configured such that the second power-supply control unit CT2 controls both the upper- and lower-arm power supply circuits 43a and 43b for the second inverter 22.

The comparative example is also configured such that a common lower-arm transformer 64 is provided for supplying a driving voltage to each of the lower-arm booster drivers Drcn and Dr1*n for the first inverter 12. Similarly, the comparative example is also configured such that a common lower-arm transformer 95 is provided for supplying a driving voltage to each of the lower-arm booster drivers Dr2*n for the second inverter 22.

Figure 5:
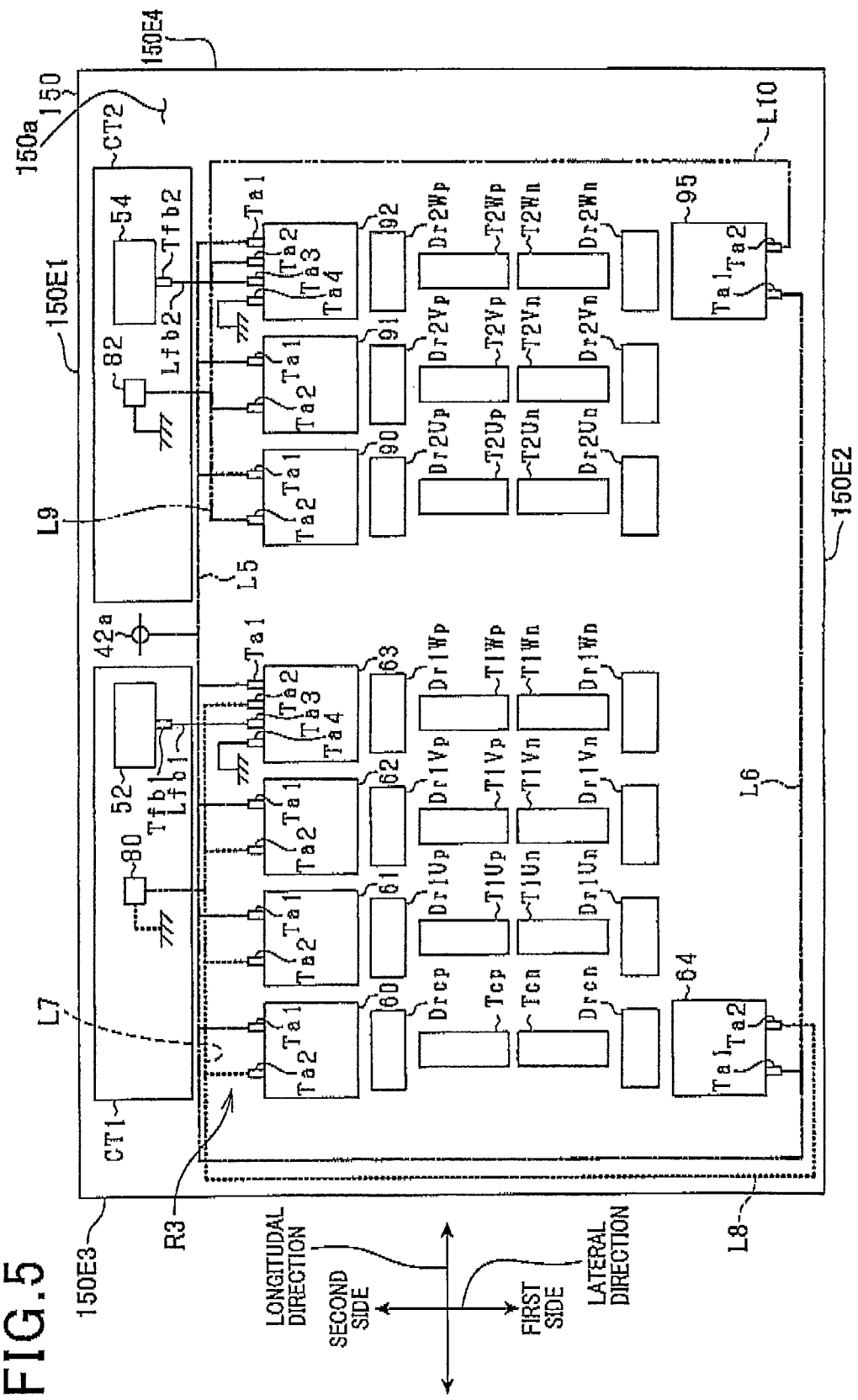
FIG. 5 is a view schematically illustrating the first outer mount surface of the board on which components are mounted according to a comparative example of the first embodiment.

FIG. 5 illustrates that the terminals Ta1 of all the upper-arm transformers 60 to 63 and 90 to 92 are connected to the terminal 42a connected to the positive terminal of the low-voltage battery 42 by a fifth wiring pattern L5, which consists of wiring paths, provided on and/or in the board 150 (see dot and dashed lines L5 in FIG. 5). The fifth wiring pattern L5 is provided in a third region. The third region is defined as a region on and in the board 150 sandwiched between the group of the first and third power-supply control units CT1 and CT3 and the group of the aligned upper-arm transformers 60 to 63 and 90 to 92 when viewed from the front of the first outer mount surface 150a.

FIG. 5 also illustrates that the terminals Ta1, of the lower-arm transformers 64 and 95 are connected to the terminal 42a connected to the positive terminal of the low-voltage battery 42 by a sixth wiring pattern L6, which consists of wiring paths, provided on and/or in the board 150 (see dot and dashed lines L6 in FIG. 5).

The wiring paths of the sixth wiring pattern L6 are drawn from the terminals Ta1 of the lower-arm transformers 64 and 95 located adjacent to the second longitudinal edge 150E2, extend along a first lateral edge E3 of the board 150 up to the third region R3, and join the fifth wiring pattern L5.

FIG. 5 illustrates that the terminals Ta2 of all the upper-arm transformers 60 to 63 are connected to the voltage-controlled switching element 80 by a seventh wiring pattern L7, which consists of wiring paths, provided in the third region R3. On the other hand, the terminal Ta2 of the lower-arm transformer 64 is connected to the voltage-controlled switching element 80 by an eighth wiring pattern, i.e. a wiring path, L8. The eighth wiring pattern L8 is drawn from the terminal Ta2 of the lower-arm transformer 64 located adjacent to the second longitudinal edge 150E2, extend along the first lateral edge E3 of the board 150 up to the third region R3, and join the seventh wiring pattern L7.

Additionally, FIG. 5 illustrates that the terminals Ta2 of all the lower-arm transformers 64 to 67 are connected to the voltage-controlled switching element 81 by a ninth wiring pattern L9, which consists of wiring paths, provided in the third region R3. On the other hand, the terminal Ta2 of the lower-arm transformer 95 is connected to the voltage-controlled switching element 80 by a tenth wiring pattern, i.e. a wiring path, L10. The tenth wiring pattern L10 is drawn from the terminal Ta2 of the lower-arm transformer 95 located adjacent to the second longitudinal edge 150E2, extend along a second lateral edge E4, which is opposite to the first lateral edge E3, of the board 150 up to the third region R3, and join the ninth wiring pattern L9.

The arrangement of the components of the comparative example result in at least each of the wiring paths included in the sixth wiring pattern L6, the eighth wiring pattern L8, and the tenth wiring pattern L10 having a length longer than each of the wiring paths included in the first, second, third, and fourth wiring patterns L1, L2, L3, and L4 of the first embodiment. The arrangement of the components of the comparative example therefore may result in an elongation of at least each of the wiring paths included in the wiring patterns L6, L8, and L10 connecting between a corresponding one of the first and second power-supply control units CT1 and CT2 and a corresponding one of the lower-arm transformers 64 and 95. An increase in length of each of the wiring paths included in the wiring patterns L6, L8, and L10 may increase radiated noise and/or conductive noise output from the wiring patterns L6, L8, and L10 due to noise generated by the switching operations of the voltage-controlled switching elements 80 and 82.

In contrast, the arrangement of the components of the first embodiment results in each of the wiring paths included in the wiring patterns L1 to L4 having a shorter length, thus more reducing radiated noise and/or conductive noise output from the wiring patterns L1 to L4.

The controller 40 described above includes the first control circuit 41 for controlling the first inverter 12, and the second control circuit 43 for controlling the second inverter 22. The first control circuit 41 includes the upper-arm power supply circuit 41a, the first power-supply control unit CT1, the lower-arm power supply circuit 41b, and the second power-supply control unit CT2. The first power-supply control unit CT1 controls the upper-arm transformers 60 to 63 of the upper-arm power supply circuit 41a, and the second power-supply control unit CT2 controls the lower-arm transformers 64 to 67 of the lower-arm power supply circuit 41b.

Additionally, the first power-supply control unit CT1 is arranged on and/or in the board 150 to be adjacent to the upper-arm transformers 60 to 63, and the second power-supply control unit CT2 is arranged on and/or in the board 150 to be adjacent to the lower-arm transformers 64 to 67.

This arrangement reduces the length of wiring paths included in the first and second wiring patterns L1 and L2 connecting between the first power-supply control unit CT1 and the upper-arm transformers 60 to 63, and the length of wiring paths included in the third and fourth wiring patterns L3 and L4 connecting between the second power-supply control unit CT2 and the lower-arm transformers 64 to 67. This reduces radiated noise and/or conductive noise output from the wiring patterns L1 to L4 due to noise caused from the switching operations of the voltage-controlled switching elements 80 and 81.

The first wiring pattern L1 connecting between the low-voltage battery 42, i.e. the terminal 42a of the battery 42, and the primary coils 60a to 63a of the upper-arm transformers 60 to 63 is located in the first region R1 on and in the board 150. The first region R1 is defined as a region on and in the board 150 sandwiched between the first power-supply control unit CT1 and the group of the aligned upper-arm transformers 60 to 63 when viewed from the front of the first outer mount surface 150a.

The second wiring pattern L2 connecting between the primary coils 60a to 63a of the upper-arm transformers 60 to 63 and the first power-supply control unit CT1 is located in the first region R1.

Additionally, the third wiring pattern L3 connecting between the low-voltage battery 42, i.e. the terminal 42a of the battery 42, and the primary coils 64a to 67a of the lower-arm transformers 64 to 67 is located in the second region R2 on and in the board 150. The second region R2 is defined as a region on and in the board 150 sandwiched between the second power-supply control unit CT2 and the group of the aligned lower-arm transformers 64 to 67 when viewed from the front of the first outer mount surface 150a.

The fourth wiring pattern L4 connecting between the primary coils 64a to 67a of the lower-arm transformers 64 to 67 and the second power-supply control unit CT2 is located in the second region R2.

These locations of the first to fourth wiring patterns L1 to L4 more reliably reduce the length of each of the wiring patterns L1 to L4, thus more reliably reducing radiated noise and/or conductive noise output from the wiring patterns L1 to L4.

The controller 40 includes the first control circuit 41 for controlling the first inverter 12 to thereby adjust torque generated by the first MG 10, and the second control circuit 43 for controlling the second inverter 22 to thereby adjust torque generated by the second MG 20.

Let us consider a case where there is a malfunction in one of a first system comprised of the first motor-generator MG 10, the first inverter 12, and the first control circuit 41 and a second system comprised of the second motor-generator MG 20, the second inverter 22, and the second control circuit 43. For this case, this configuration of the controller 40 set forth above enables the other of the first system and the second system to operate in a limp-home mode. This enables the hybrid vehicle to travel slowly toward a safety place or another similar place.

Second Embodiment

A motor-generator drive system CS1 according to the second embodiment of the present disclosure will be described hereinafter with reference to FIG. 6.

The structure and functions of the motor-generator control system CS1 are different from those of the motor-generator control system CS by the following points. So, the different points will be mainly described hereinafter.

Figure 6:
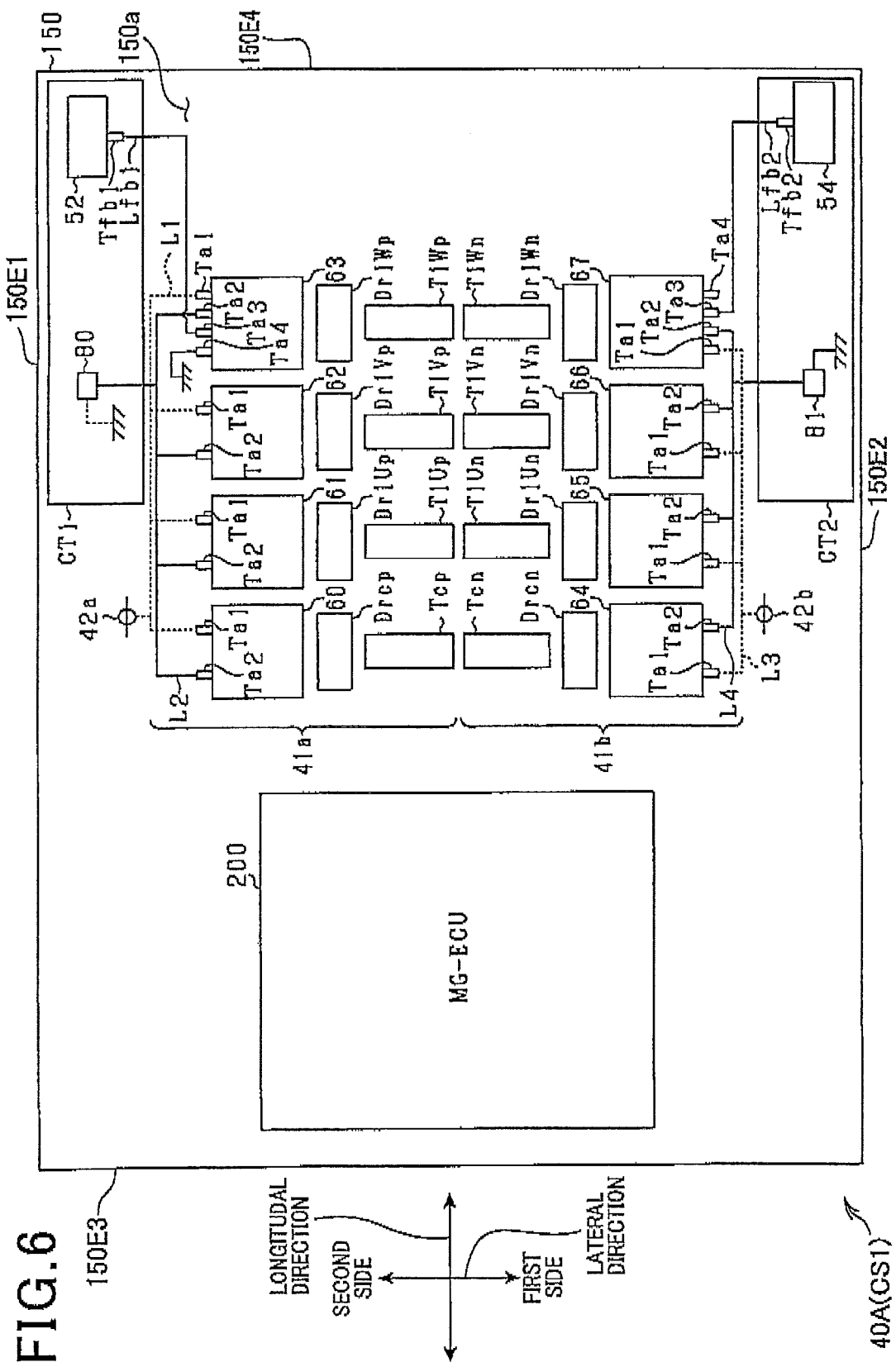
FIG. 6 is a view schematically illustrating the first outer mount surface of the board on which components are mounted according to the second embodiment of the present disclosure.

Referring to FIG. 6, the motor-generator control system CS1 uses an ECU 200 for controlling each of the upper- and lower-arm drivers Drcp, Dr1*p, Drcn, and Dr1*n to thereby control on and off operations of a corresponding one of the upper- and lower-arm switching elements Sop, S1*p, Scn, and S1*n. Note that the second embodiment is applied to a hybrid vehicle in which the second system comprised of the second motor-generator MG 20, the second inverter 22, and the second control circuit 43 are eliminated. Thus, motor-generator control system CS1 includes a controller 40A without including the second control circuit 43.

The ECU 200, referred to as an MG ECU 200, is mounted on the first outer mount surface 150a of the board 150. The motor-generator control system CS1 may cause a risk that radiated noise and/or conductive noise output from the wiring patterns L1 to L4 due to noise generated by the switching operations of the first control circuit 41 are transferred to the MG ECU 200.

To address such a risk, the upper- and lower-arm power-supply control units CT1 and CT2 are arranged to be sufficiently separated from the MG-ECU 200 on the first outer mount surface 150a of the board 150.

For example, an example of the structure of the controller 40A installed in the board 150 is illustrated in FIG. 6. Referring to FIG. 6, the MG-ECU 200 is located on the first outer mount surface 150a of the board 150 to be adjacent to the first lateral edge E3 of the board 150. In contrast, the upper- and lower-arm power-supply control units CT1 and CT2 are located on the first outer mount surface 150a of the board 150 to be adjacent to the second lateral edge E4 of the board 150.

In other words, the upper- and lower-arm power-supply control units CT1 and CT2 are far from the MG-ECU 200 than the upper- and lower-arm power supply circuits 41a and 41b are. Specifically, the MG-ECU 200 is shifted relative to the upper- and lower-arm power supply circuits 41a and 41b toward a first side, i.e. a left side, in the longitudinal direction of the board 150. In contrast, the upper- and lower-arm power-supply control units CT1 and CT2 are shifted relative to the upper- and lower-arm power supply circuits 41a and 41b toward a second side, i.e. a right side, in the longitudinal direction of the board 150.

This component layout on the first outer mount surface 150a maintains a wide space between the MG-ECU 200 and the upper- and lower-arm power-supply control units CT1 and CT2. This reduces adverse effects due to transfer of radiated noise and/or conductive noise output from the wiring patterns L1 to L4 due to noise generated by the switching operations of the voltage-controlled switching element 80.

Third Embodiment

A motor-generator drive system CS2 according to the third embodiment of the present disclosure will be described hereinafter with reference to FIG. 7.

The structure and functions of the motor-generator control system CS2 are different from those of the motor-generator control system CS by the following points. So, the different points will be mainly described hereinafter.

The lower-arm power supply circuit 41b of the controller 40 according to the first embodiment includes the lower-arm transformers 64, 65, 66, and 67 individually provided for the respective lower-arm switching elements Scn, S1Un, S1Vn, and S1Wn. Similarly, the lower-arm power supply circuit 43b according to the first embodiment includes the lower-arm transformers 93, 94, and 95 individually provided for the respective lower-arm switching elements S2Un, S2Vn, and S2Wn.

In contrast, a lower-arm power supply circuit 41b1 of a controller 40B according to the third embodiment includes a common lower-arm transformer 96a commonly provided for the lower-arm drivers Drcn, Dr1Un, Dr1Vn, and Dr1Wn for the lower-arm switching elements Son, S1Un, S1Vn, and S1Wn. Similarly, a lower-arm power supply circuit 43b1 of the controller 40B according to the third embodiment includes a common lower-arm transformer 96b commonly provided for the lower-arm drivers Dr2Un, Dr2Vn, and Dr2Wn for the lower-arm switching elements S2Un, S2Vn, and S2Wn.

This configuration of the controller 40B has therefore a more simple structure.

It is preferable that arrangement of the common lower-arm transformers 96a and 96b on the first outer mount surface 150a of the board 150 is determined to reduce the length of the wiring paths included in the second wiring pattern L2 connecting between the terminal 42b of the low-voltage battery 40 and the terminal Ta1 of each of the common lower-arm transformers 96a and 96b.

Figure 7:
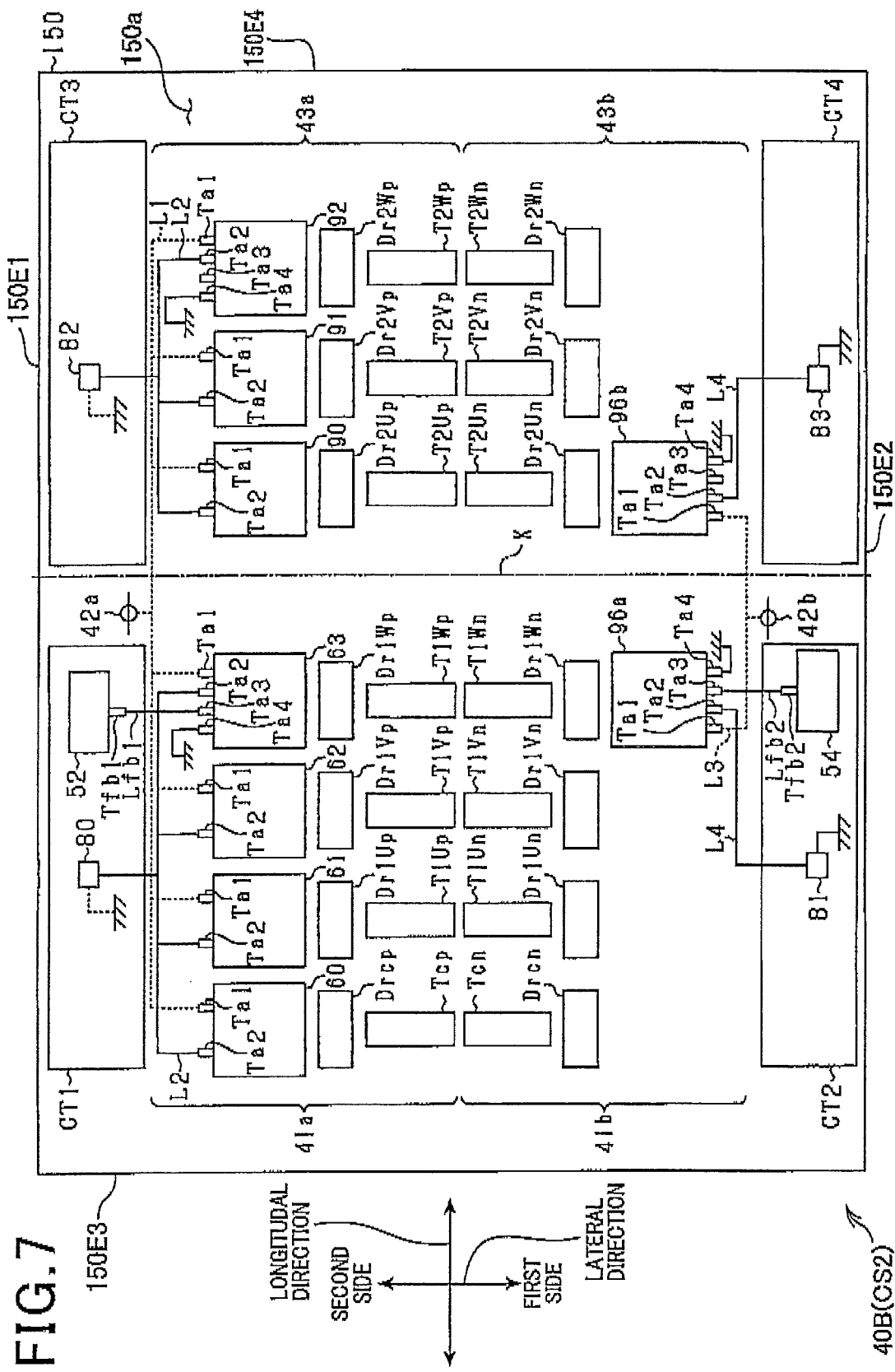
FIG. 7 is a view schematically illustrating the first outer mount surface of the board on which components are mounted according to the third embodiment of the present disclosure.

Specifically, referring to FIG. 7, the first outer mount surface 150a is divided by a boundary K into the first half area for location of the components of the first control circuit 41 and the second half area for location of the components of the second control circuit 43. The common lower-arm transformers 96a and 96b are mounted on the respective first and second half areas of the first outer mount surface 150a to be 3a sufficiently close to the boundary K. For example, the common lower-arm transformer 96a can be mounted on the first half area of the first outer mount surface 150a to face the W-phase lower-arm driver Dr1Wn, and the common lower-arm transformer 96b can be mounted on the second half area of the first outer mount surface 150a to face the U-phase lower-arm driver Dr2Un.

This arrangement of the common lower-arm transformers 96a and 96b according to the third embodiment more reduces the length of the wiring paths included in the wiring pattern L2 connecting between the terminal 42b of the low-voltage battery 40 and the terminal Ta1 of each of the common lower-arm transformers 96a and 96b, This therefore more reduces radiated noise and/or conductive noise output from the wiring pattern L2 due to noise caused from the switching operations of the voltage-controlled switching elements 80 and 81.

Fourth Embodiment

Figure 8:
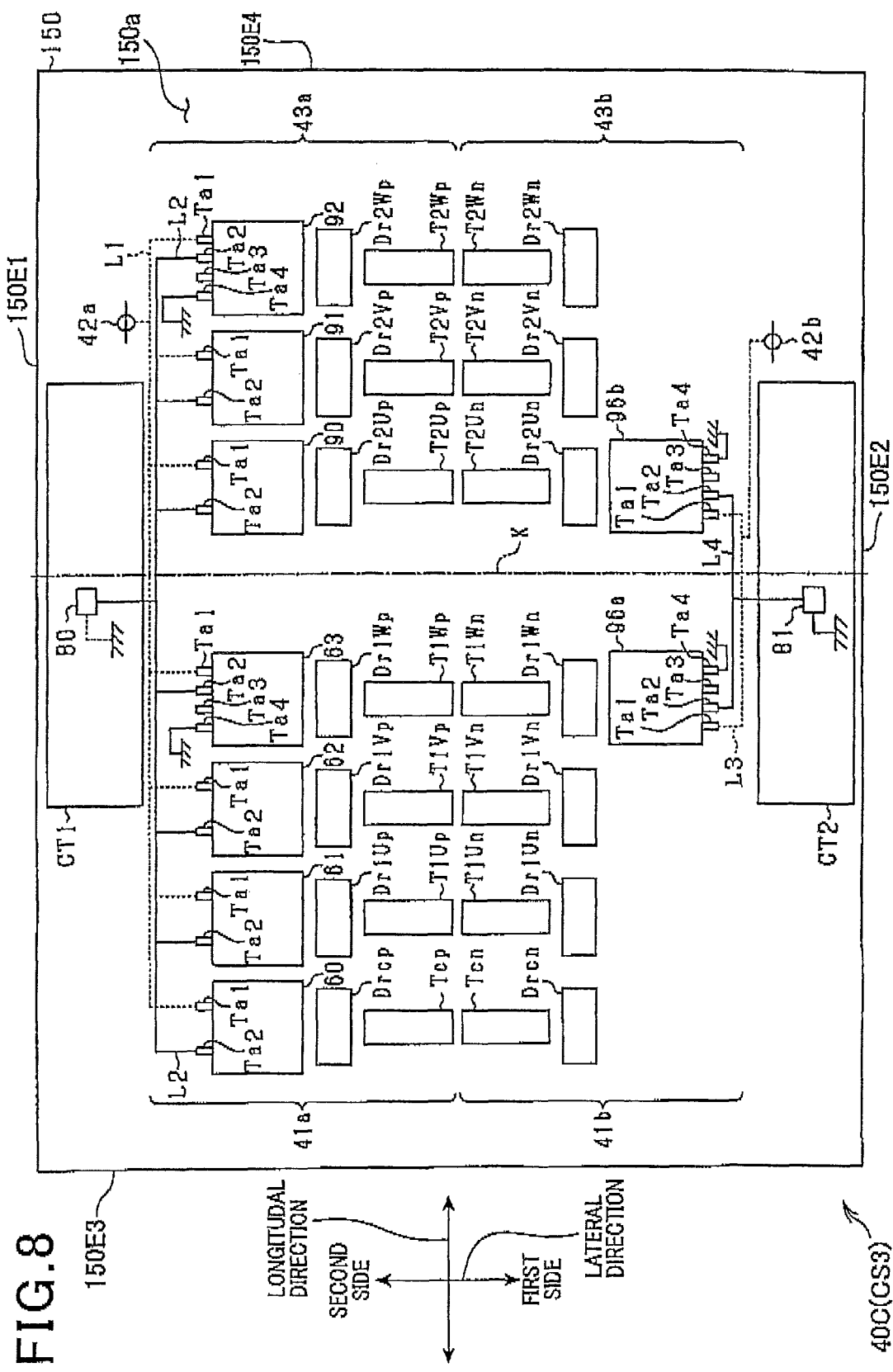
FIG. 8 is a view schematically illustrating the first outer mount surface of the board on which components are mounted according to the fourth embodiment of the present disclosure

A motor-generator drive system CS3 according to the fourth embodiment of the present disclosure will be described hereinafter with reference to FIG. 8.

The structure and functions of the motor-generator control system CS3 are different from those of the motor-generator control system CS2 by the following points. So, the different points will be mainly described hereinafter.

The first power-supply control unit CT1 and the third power-supply control unit CT3 of the controller 40 are individually provided for controlling the respective upper-arm power-supply circuit 41a for the first inverter 12 and the upper-arm power-supply circuit 43a for the second inverter 22. Similarly, the second power-supply control unit CT2 and the fourth power-supply control unit CT4 of the controller 40 are individually provided for controlling the respective lower-arm power-supply circuit 41b for the first inverter 12 and the lower-arm power-supply circuit 43b for the second inverter 22.

In contrast, a controller 40C according to the fourth embodiment includes a first common power-supply control unit CT1A commonly provided for controlling both the upper-arm power-supply circuit 41a for the first inverter 12 and the upper-arm power-supply circuit 43a for the second inverter 22. Additionally, the controller 40C includes a second common power-supply control unit CT2A commonly provided for controlling both the lower-arm power-supply circuit 41b for the first inverter 12 and the lower-arm power-supply circuit 43b for the second inverter 22.

This configuration of the controller 40C has therefore a more simple structure.

It is preferable that each of the first and second common power-supply control units CT1A and CT2A is mounted on the boundary K and on both the first and second half areas. This arrangement of each of the first and second common power-supply control units CT1A and CT2A more reduces the length of the first to fourth wiring patterns L1 to L4 while simplifying the structure of the controller 4C.

This configuration of the controller 40C results in (1) The first power-supply control unit CT1A to be shared between the upper-arm power-supply circuit 41a for the first inverter 12 and the upper-arm power-supply circuit 43a for the second inverter 22

(2) The second power-supply control unit CT2A to be shared between the lower-arm power-supply circuit 41b for the first inverter 12 and the lower-arm power-supply circuit 43b for the second inverter 22.

This configuration results in reduction of variations between the output torque or the output power of the first MG 10 and the output torque or the output power of the second MG 20.

The present disclosure is not limited to the aforementioned embodiments, and can be modified within the scope thereof.

As described above, the second system comprised of the second motor-generator MG 20, the second inverter 22, and the second control circuit 43 can be eliminated in each of the first to fourth embodiments.

A three-phase motor-generator is used for each of the first and second MG 10 and 20, but another multiphase rotary machine can be used for each of the first and second MGs 10 and 20.

While the illustrative embodiments of the present disclosure have been described herein, the present disclosure is not limited to the embodiments described herein, but includes any and all embodiments having modifications, omissions, combinations (e.g., of aspects across various embodiments), adaptations and/or alternations as would be appreciated by those in the art based on the present disclosure. The limitations in the claims are to be interpreted broadly based on the language employed in the claims and not limited to examples described in the present specification or during the prosecution of the application, which examples are to be construed as non-exclusive.

What is claimed is:

1. A power supply apparatus for a power converter including a plurality of upper-arm switching elements and a plurality of lower-arm switching elements, the power supply apparatus comprising:

a board;

an upper-arm power supply circuit mounted to the board, the upper-arm power supply circuit comprising a plurality of upper-arm transformers connected to a DC power source and to the respective upper-arm switching elements, each of the upper-arm transformers being configured to generate, based on an output voltage of the DC power source, a first voltage for driving a corresponding one of the upper-arm switching elements;

a lower-arm power supply circuit mounted to the board, the lower-arm power supply circuit comprising at least one lower-arm transformer connected to the DC power source and to the lower-arm switching elements, the at least one lower-arm transformer being configured to generate, based on the output voltage of the DC power source, a second voltage for driving each of the lower-arm switching elements;

an upper-arm control unit mounted to the board, the upper-arm control unit comprising a first voltage-controlled switching element connected between the DC power source and a primary side of each of the upper-arm transformers, the upper-arm control unit controlling on and off operations of the first voltage-controlled switching element to thereby control supply of the output voltage of the DC power source to the primary side of each of the upper-arm transformers; and a lower-arm control unit mounted to the board, the lower-arm control unit comprising a second voltage-controlled switching element connected between the DC power source and a primary side of the at least one lower-arm transformer, the lower-arm control unit controlling on and off operations of the second voltage-controlled switching element to thereby control supply of the output voltage of the DC power source to the primary side of the at least one lower-arm transformers, each of the upper-arm transformers being arranged adjacent to the upper-arm control unit, the at least one lower-arm transformer being arranged adjacent to the lower-arm control unit.

2. A power supply apparatus for a power converter including a plurality of upper-arm switching elements and a plurality of lower-arm switching elements, the power supply apparatus comprising:

a board having a mount surface;

an upper-arm power supply circuit mounted on the mount surface of the board, the upper-arm power supply circuit comprising a plurality of upper-arm transformers and a plurality of upper-arm connectors, the upper-arm transformers being connected to a DC power source and to the respective upper-arm switching elements via the respective upper-arm connectors, each of the upper-arm transformers being configured to generate, based on an output voltage of the DC power source, a first voltage for driving a corresponding one of the upper-arm switching elements, the upper-arm connectors being mounted on the mount surface to be aligned;

a lower-arm power supply circuit mounted on the mount surface of the board, the lower-arm power supply circuit comprising at least one lower-arm transformer and a plurality of lower-arm connectors, the at least one lower-arm transformer being connected to the DC power source and to the lower-arm switching elements via the respective lower-arm connectors, the at least one lower-arm transformer being configured to generate, based on the output voltage of the DC power source, a second voltage for driving each of the lower-arm switching elements, the lower-arm connectors being mounted on the mount surface to be aligned with each other;

an upper-arm control unit mounted on the mount surface of the board, the upper-arm control unit comprising a first voltage-controlled switching element connected between the DC power source and a primary side of each of the upper-arm transformers, the upper-arm control unit controlling on and off operations of the first voltage-controlled switching element to thereby control supply of the output voltage of the DC power source to the primary side of each of the upper-arm transformers; and a lower-arm control unit mounted on the mount surface of the board, the lower-arm control unit comprising a second voltage-controlled switching element connected between the DC power source and a primary side of the at least one lower-arm transformer, the lower-arm control unit controlling on and off operations of the second voltage-controlled switching element to thereby control supply of the output voltage of the DC power source to the primary side of the at least one lower-arm transformers, an alignment of the upper-arm connectors being juxtaposed to an alignment of the lower-arm connectors, the upper-arm transformers and the upper-arm control unit being arranged such that the upper-arm transformers and the alignment of the upper-arm connectors are sandwiched between the upper-arm control unit and the alignment of the lower-arm connectors, the at least one lower-arm transformer and the lower-arm control unit being arranged such that the at least one lower-arm transformer and the alignment of the lower-arm connectors are sandwiched between the lower-arm control unit and the alignment of the upper-arm connectors.

3. The power supply apparatus according to claim 2, wherein:

the board comprises:

a first wiring pattern connecting between the primary side of each of the upper-arm transformers and the DC power source;

a second wiring pattern connecting between the primary side of each of the upper-arm transformers and the upper-arm control unit;

a third wiring pattern connecting between the primary side of the at least one lower-arm transformer and the DC power source; and a fourth wiring pattern connecting between the primary side of the at least one lower-arm transformer and the lower-arm control unit;

the first and second wiring patterns are arranged in a first region on and in the board, the first region being sandwiched between the upper-arm control unit and the upper-arm transformers when the board is viewed from a front of the mount surface; and the third and fourth wiring patterns are arranged in a second region on and in the board, the second region being sandwiched between the lower-arm control unit and the at least one lower-arm transformer when the board is viewed from the front of the mount surface.

4. The power supply apparatus according to claim 2, wherein the power converter is configured to convert first electrical power input thereto into second electrical power in accordance with on and off operations of the upper- and lower-arm switching elements, the converted power being supplied to an electrical load, the power supply apparatus further comprising:

a load control unit mounted on the mount surface of the board and configured to control the on and off operations of each of the upper- and lower-arm switching elements to thereby control the electrical load, the upper- and lower-arm control units being far from the load control unit than the upper- and lower-arm power supply circuits are.

5. The power supply apparatus according to claim 4, wherein the load control unit is shifted relative to the upper- and lower-arm power supply circuits toward a first side of a direction parallel to an alignment direction of each of the upper- and lower-arm connectors, and the upper- and lower-arm control units are shifted relative to the upper- and lower-arm power supply circuits toward a second side of the direction parallel to the alignment direction of each of the upper- and lower-arm connectors, the second side being opposite to the first side.

6. The power supply apparatus according to claim 2, wherein:

the power converter comprises a first power converter and a second power converter each including the plurality of upper-arm switching elements and the plurality of lower-arm switching elements;

the upper-arm power supply circuit comprises a first upper-arm power supply circuit and a second upper-arm power supply circuit provided for the respective first and second power converters;

the lower-arm power supply circuit comprises a first lower-arm power supply circuit and a second lower-arm power supply circuit provided for the respective first and second power converters;

the upper-arm control unit comprises a first upper-arm control unit and a second upper-arm control unit provided for the respective first and second upper-arm power supply circuits; and the lower-arm control unit comprises a first lower-arm control unit and a second lower-arm control unit provided for the respective first and second lower-arm power supply circuits.

7. The power supply apparatus according to claim 2, wherein:

the power converter comprises a first power converter connected to a first electrical load and a second power converter connected to a second electrical load, each of the first and second power converters including the plurality of upper-arm switching elements and the plurality of lower-arm switching elements;

the upper-arm power supply circuit comprises a first upper-arm power supply circuit and a second upper-arm power supply circuit provided for the respective first and second power converters;

the lower-arm power supply circuit comprises a first lower-arm power supply circuit and a second lower-arm power supply circuit provided for the respective first and second power converters;

the upper-arm control unit is connected to the upper-arm transformers of the first upper-arm power supply circuit and the upper-arm transformers of the second upper-arm power supply circuit;

the lower-arm control unit is connected to the at least one lower-arm transformer of the first lower-arm power supply circuit and the at least one lower-arm transformer of the second lower-arm power supply circuit; and the mount surface of the board is divided into a first area and a second area by a predetermined boundary;

the first upper- and lower-arm power supply circuits and the second upper- and lower-arm power supply circuits are arranged on the respective first and second areas of the mount surface.

8. The power supply apparatus according to claim 7, wherein:

the upper-arm control unit is arranged on the boundary and on both the first and second areas of the mount surface; and the lower-arm control unit is arranged on the boundary and on both the first and second areas of the mount surface.

9. The power supply apparatus according to claim 8, wherein:

the at least one lower-arm transformer included in each of the first lower-arm power supply circuit and the second lower-arm power supply circuit is a single common lower-arm transformer for the respective lower-arm switching elements of a corresponding one of the first and second power converters;

the single common lower-arm transformer included in the first lower-arm power supply circuit is located in a first region of the mount surface to be close to the boundary, the first region of the mount surface being sandwiched between the alignment of the lower-arm connectors of the first lower-arm power supply circuit and the lower-arm control unit; and the single common lower-arm transformer included in the second lower-arm power supply circuit is located in a second region of the mount surface to be close to the boundary, the second region of the mount surface being sandwiched between the alignment of the lower-arm connectors of the second lower-arm power supply circuit and the lower-arm control unit.

10. The power supply apparatus according to claim 7, wherein:

the at least one lower-arm transformer included in each of the first lower-arm power supply circuit and the second lower-arm power supply circuit is a single common lower-arm transformer for the respective lower-arm switching elements of a corresponding one of the first and second power converters;

the upper-arm control unit comprises a first upper-arm control unit and a second upper-arm control unit provided for the respective first and second upper-arm power supply circuits;

the lower-arm control unit comprises a first lower-arm control unit and a second lower-arm control unit provided for the respective first and second lower-arm power supply circuits;

the single common lower-arm, transformer included in the first lower-arm power supply circuit is located in a first region of the mount surface to be close to the boundary, the first region of the mount surface being sandwiched between the alignment of the lower-arm connectors of the first lower-arm power supply circuit and the first lower-arm control unit; and the single common lower-arm transformer included in the second lower-arm power supply circuit is located in a second region of the mount surface to be close to the boundary, the second region of the mount surface being sandwiched between the alignment of the lower-arm connectors of the second lower-arm power supply circuit and the second lower-arm control unit.

* * * * *